US009103891B2

(12) United States Patent
Miyamoto

(10) Patent No.: US 9,103,891 B2
(45) Date of Patent: Aug. 11, 2015

(54) VOLTAGE MONITORING CIRCUIT, TEST METHOD THEREFOR, AND VOLTAGE MONITORING SYSTEM

(71) Applicant: Renesas Electronics Corporation, Kawasaki-shi, Kanagawa (JP)

(72) Inventor: Manabu Miyamoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/493,444

(22) Filed: Sep. 23, 2014

(65) Prior Publication Data

US 2015/0008930 A1 Jan. 8, 2015

Related U.S. Application Data

(63) Continuation of application No. 13/589,158, filed on Aug. 19, 2012, now Pat. No. 8,860,423.

(30) Foreign Application Priority Data

Sep. 2, 2011 (JP) .................................. 2011-191653

(51) Int. Cl.
*G01N 27/416* (2006.01)
*G01R 31/36* (2006.01)
*G01R 31/02* (2006.01)

(52) U.S. Cl.
CPC ............ *G01R 31/362* (2013.01); *G01R 31/025* (2013.01); *G01R 31/3658* (2013.01)

(58) Field of Classification Search
CPC . G01R 31/362; G01R 31/3658; G01R 31/025
USPC ......... 324/425–440, 444, 255, 500, 522, 713, 324/72.5, 76.39, 76.77, 111; 320/104–107, 320/132, 130; 327/540, 530, 538, 546, 555, 327/416, 427
See application file for complete search history.

(56) References Cited

U.S. PATENT DOCUMENTS

| 6,362,627 B1 | 3/2002 | Shimamoto et al. |
| 6,762,588 B2 | 7/2004 | Miyazaki et al. |
| 8,564,277 B2 | 10/2013 | Wortham et al. |

(Continued)

FOREIGN PATENT DOCUMENTS

| JP | 11-248755 A | 9/1999 |
| JP | 2003-070179 A | 3/2003 |

(Continued)

OTHER PUBLICATIONS

Office Action issued Jan. 27, 2015, in Japanese Patent Application No. 2011-191653.

*Primary Examiner* — Melissa Koval
*Assistant Examiner* — Trung Nguyen
(74) *Attorney, Agent, or Firm* — Miles & Stockbridge P.C.

(57) ABSTRACT

A voltage monitoring circuit includes a plurality of voltage input terminals which input a voltage across each of a plurality of series-coupled battery cells, a selection circuit which, by selecting two of the voltage input terminals, selects a voltage across one of the battery cells, an A/D converter which converts the voltage across the battery cell into a digital value, a control unit which sends the digital value to an external controller, a ground wiring which is coupled to a ground terminal for inputting a ground level voltage for the voltage monitoring circuit, the ground terminal being among the voltage input terminals, and through which the voltage monitoring circuit is supplied with the ground level voltage, a terminal which is supplied with a lowest fixed potential, and a switch circuit which is coupled between the first terminal and the ground wiring.

7 Claims, 12 Drawing Sheets

(56) References Cited

U.S. PATENT DOCUMENTS

| | | |
|---|---|---|
| 8,587,262 B2 | 11/2013 | Kouchi et al. |
| 8,723,678 B2 | 5/2014 | Ju et al. |
| 2010/0209748 A1 | 8/2010 | Kudo et al. |
| 2012/0161859 A1 | 6/2012 | Kim et al. |
| 2014/0125405 A1 | 5/2014 | Miwa et al. |

FOREIGN PATENT DOCUMENTS

| | | |
|---|---|---|
| JP | 2009-198448 A | 9/2009 |
| JP | 2010-193589 A | 9/2010 |

VOLTAGE MONITORING CIRCUIT, TEST METHOD THEREFOR, AND VOLTAGE MONITORING SYSTEM

CROSS-REFERENCE TO RELATED APPLICATIONS

The disclosure of Japanese Patent Application No. 2011-191653 filed on Sep. 2, 2011 including the specification, drawings and abstract is incorporated herein by reference in its entirety.

BACKGROUND

The present invention relates to a voltage monitoring circuit, a test method therefor, and a voltage monitoring system.

In an existing secondary battery system for vehicle, plural battery groups each including series-coupled battery cells are coupled to configure a battery module, and a control device for monitoring the state of the battery cells of each of the battery groups is provided. An example technique of such a battery system is disclosed in Japanese Unexamined Patent Publication No. 2010-193589.

FIG. 12 shows the battery system 1 disclosed in Japanese Unexamined Patent Publication No. 2010-193589. The battery system 1 has battery cells BC1 to BC6 and a cell controller 2. The cell controller 2 has a battery cell controller IC1 and a Schottky diode Db associated with the battery cells BC1 to BC6.

The battery cell controller IC1 includes a multiplexer (MUX) 11, a voltage regulator circuit 12, a differential amplifier 13, an analog-to-digital converter circuit (hereinafter referred to as an "ADC") 14, an IC control circuit 15, diodes D1 and D2 for ESD protection, and terminals CV1 to CV6, VCC and GND. The terminals CV1 to CV6 and GND are coupled, via sensing lines SL, to the positive electrodes and negative electrodes of the battery cells BC1 to BC6. The sensing lines SL are provided between the positive and negative electrodes of the battery cells BC1 to BC6 and input terminals IN1 to IN7 provided on the circuit substrate side.

The multiplexer 11 has terminal voltages of the battery cells BC1 to BC6 inputted thereto via the terminals CV1 to CV6 and GND. The multiplexer 11 selects one of the terminals CV1 to CV6 and outputs the corresponding terminal voltage to the differential amplifier 13. The terminal GND serves as a ground terminal (hereinafter referred to as the "ground terminal GND") for the battery cell controller IC1. The terminal VCC serves as a supply voltage terminal (hereinafter referred to as the "power supply terminal VCC") for the battery cell controller IC1. The multiplexer 11 uses the voltage supplied from the power supply terminal VCC as a supply voltage.

The differential amplifier 13 amplifies the terminal voltage received from the multiplexer 11 and outputs the amplified voltage to the ADC 14. The ADC 14 outputs the inputted voltage after analog-to-digital conversion. The digital signal outputted from the ADC 14 is stored in the IC control circuit 15 and is used, for example, for diagnosing the battery system 1. When a fault is detected, it is eventually reported to a higher-level controller.

The voltage regulator circuit 12 provides the differential amplifier 13, ADC 14 and IC control circuit 15 with a supply voltage. The voltage regulator circuit 12 is coupled, via a line, to the terminal CV6. The voltage supplied from the terminal CV6 is used as a bias voltage for the voltage regulator circuit 12.

For all of the terminals CV1 to CV6, diodes D1 and D2 for ESD protection are coupled between the power supply terminal VCC and the ground terminal GND.

If the Schottky diode Db is not provided, disconnection of the lowest-order sensing line SL causes the current used by the battery cell controller IC1 to flow from the ground terminal GND to the positive electrode side of the battery cell BC6 via the diode D2 for ESD protection and the terminal CV6. As a result, the terminal CV6 is negatively biased corresponding to a voltage drop (0.6 to 0.7 V) through the diode D2 for ESD protection causing the voltage regulator circuit 12 to stop operation. When the voltage regulator circuit 12 stops operation, the differential amplifier 13, ADC 14 and IC control circuit 15 also stop operation, so that detection of a fault cannot be reported to a higher-lever controller.

To prevent the above problem, the battery system disclosed in Japanese Unexamined Patent Publication No. 2010-193589 is provided with a Schottky diode Db smaller than the diode D2 for ESD protection. With the voltage drop through the Schottky diode Db being as small as 0.3V, the negative voltage applied to the terminal CV6 in the event of disconnection of the lowest-order sensing line SL described above can be reduced to allow the voltage regulator circuit 12 to continue operation. Hence, when a fault is detected, it can be normally reported to a higher-order controller.

SUMMARY

As described above, even though, according to the technique disclosed in Japanese Unexamined Patent Publication No. 2010-193589, disconnection of a sensing line can be detected as a fault, when the ground terminal GND of the battery cell controller IC1 develops an open fault, the open fault cannot be detected.

In such a case, the circuit current flows out from a low-potential terminal among the terminals provided for the battery cell controller IC1, for example, an address setting terminal for inputting a low level voltage to the battery cell controller IC1 via a parasitic diode of a constituent NMOS transistor or a diode for ESD protection included in the battery cell controller IC1. In such a state, the GND voltage inside the IC rises by a potential equivalent to the potential of one diode relative to the voltage of the ground terminal GND. This causes voltage measurement of the battery cell BC6 to output a value lower than the real voltage by a value equivalent to the voltage of one diode.

When, in the above state, no open fault of the ground terminal GND is detected, charging of the battery module allows the battery cell BC6 to be overcharged to possibly cause a fault or quality deterioration of the battery system, thus posing a problem.

According to a first aspect of the present invention, a Voltage monitoring circuit is provided which has: a plurality of voltage input terminals for inputting a voltage across each of a plurality of series-coupled battery cells; a selection circuit which, by selecting two of the voltage input terminals, selects a voltage across one of the battery cells; an A/D converter which converts the voltage across the battery cell selected by the selection circuit into a digital value; and a control unit which sends the digital value outputted from the A/D converter to an external controller. The voltage monitoring circuit includes: a ground wiring which is coupled to a ground terminal for inputting a ground level voltage for the voltage monitoring circuit, the ground terminal being among the voltage input terminals, and through which the voltage monitoring circuit is supplied with the ground level voltage; a first terminal supplied with a lowest fixed potential; and a first switch circuit coupled between the first terminal and the ground wiring.

According to a second aspect of the present invention, testing method of the voltage monitoring circuit includes putting, in response to a first test command from the external controller, the first switch circuit in a conducting state; after the putting of the first switch circuit in the conducting state, sending, in response to a first voltage monitoring command from the external controller, to the external controller a first digital value obtained when the selection circuit at least has a voltage across one of the battery cells selected, the one of the battery cells being coupled to the ground terminal; putting, in response to a second test command from the external controller, the first switch circuit in a non-conducting state; after the putting of the first switch circuit in the non-conducting state, sending, in response to a second voltage monitoring command from the external controller, to the external controller a second digital value obtained when the selection circuit at least has a voltage across one of the battery cells selected, the one of the battery cells being coupled to the ground terminal; and comparing the first digital value and the second digital value to determine an open fault of the ground terminal.

According to a third aspect of the present invention, a voltage monitoring system is provided which has: a plurality of voltage monitoring circuits each of which converts a voltage across a battery cell among a plurality of series-coupled battery cells into a digital signal and outputs the digital signal; and a controller which detects, based on a digital signal received from each of the voltage monitoring circuits, detects a fault of a battery cell corresponding to the each of the voltage monitoring circuits. In the voltage monitoring system: each of the voltage monitoring circuits includes a ground terminal far inputting a ground level voltage for the voltage monitoring circuit, a first terminal supplied with a fixed lowest potential and a switch circuit coupled between a ground wiring for supplying the ground level voltage to the voltage monitoring circuit and the first terminal; and the switch circuit has a conducting state thereof controlled in accordance with a test signal from the controller.

According to the aspects of the present invention, when the ground terminal develops an open fault, the digital values outputted by the A/D converter depending on whether the first switch circuit is conducting or not become unequal, so that the ground terminal open fault of the voltage monitoring circuit can be detected.

The present invention makes it possible to detect an open fault of a ground terminal included in a voltage monitoring circuit so as to prevent failure or quality deterioration of a battery system.

DETAILED DESCRIPTION

Figure 1:
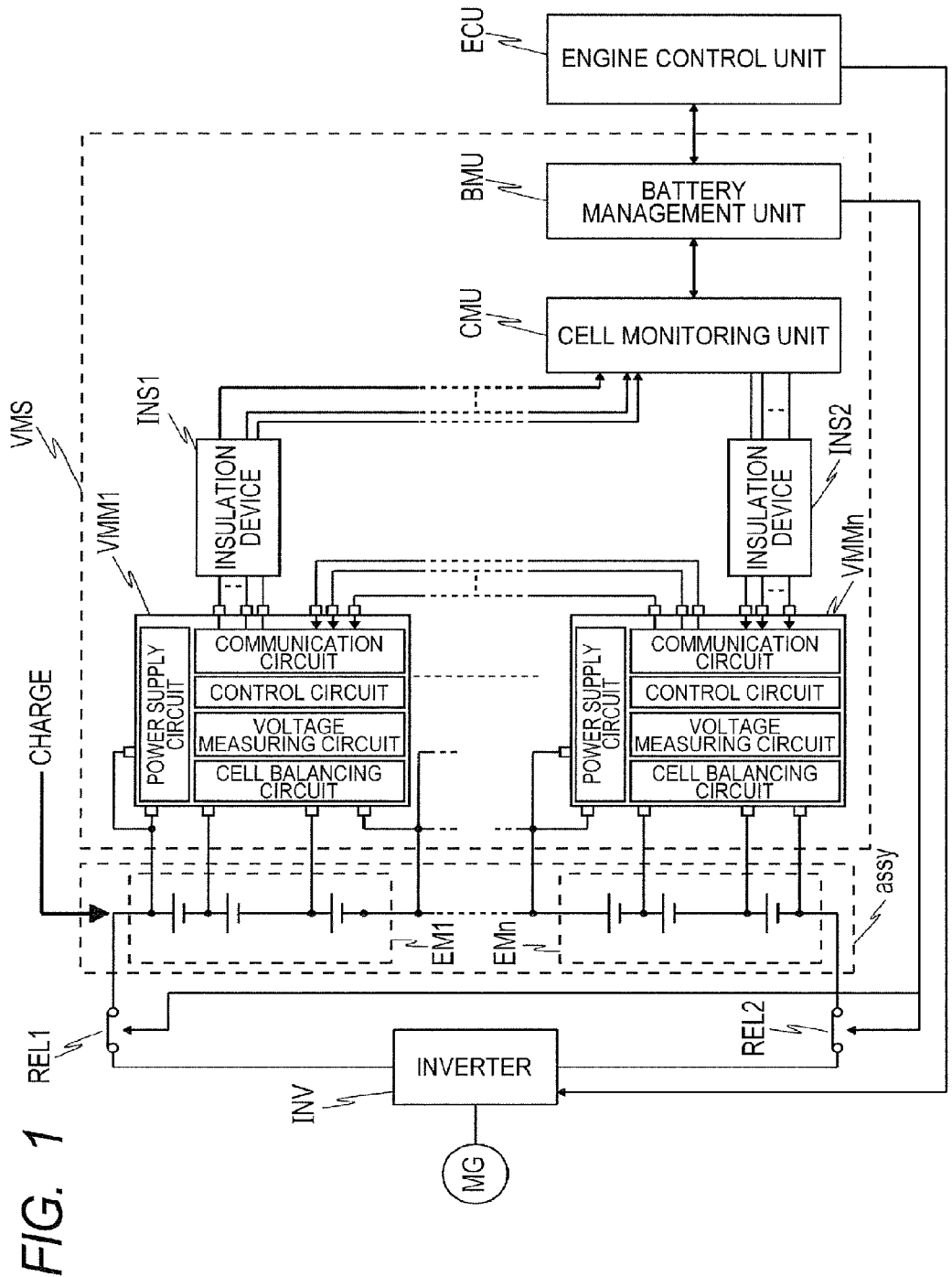
FIG. 1 is a block diagram showing a configuration of a voltage monitoring system.

Embodiments of the present invention will be described below with reference to drawings. In the drawings referred to below, like elements are denoted by like reference numerals or symbols and, in the following, duplicate description of such elements is appropriately avoided.

A voltage monitoring system for monitoring the output voltage of an assembled battery used to supply power to, for example, an electric vehicle will be described below as a basis for understanding embodiments of the present invention. First, a configuration of such a voltage monitoring system will be outlined with reference to a configuration block diagram shown in FIG. 1. A voltage monitoring system VMS is comprised of voltage monitoring modules VMM1 to VMMn (n being an integer of 2 or larger), insulation elements INS1 and INS2, a cell monitoring unit CMU, and a battery management unit BMU. The cell monitoring unit CMU and the battery management unit BMU are comprised of, for example, a microcomputer.

The voltage monitoring system VMS monitors the output voltage of an assembled battery assy using voltage monitoring modules VMM1 to VMMn. The assembled battery assy includes as many as n series-coupled battery modules EM1 to EMn. The battery modules EM1 to EMn each include as many as m series-coupled battery cells (m being an integer of 2 or larger). Namely, the assembled battery assy includes (m×n) series-coupled battery cells making it possible to output a high voltage.

The cell monitoring unit CMU is coupled to communication input terminals of the voltage monitoring module VMMn via the insulation element INS2 and is coupled to communication output terminals of the voltage monitoring module VMM1 via the insulation element INS1. The insulation elements INS1 and INS are, for example, photocouplers and electrically isolate the cell monitoring unit CMU from the voltage monitoring modules VMM1 to VMMn. This prevents, in the event of a fault, the cell monitoring unit CMU from being subjected to a high voltage applied from the assembled battery assy and being thereby damaged.

The cell monitoring unit CMU is also coupled to the battery management unit BMU. The cell monitoring unit CMU calculates the output voltage of each battery cell based on the results of voltage monitoring by the voltage monitoring modules VMM1 to VMMn and notifies the Calculation results to the battery management unit BMU. Furthermore, the cell monitoring unit CMU controls the operation of the voltage monitoring modules VMM1 to VMMn in accordance with commands given from the battery management unit BMU. The battery management unit BMU is also coupled to the engine control unit ECU. The battery management unit BMU controls the operation of the voltage monitoring system VMS based on the output voltage of each battery cell notified from the cell monitoring unit CMU and in according with commands given from the engine control unit ECU. The battery management unit BMU also notifies information about the states of voltage monitoring system VMS and assembled battery assy to the engine control unit ECU. The operation of the cell monitoring unit CMU and the battery management unit BMU will be described in detail in describing the operation of the voltage monitoring system VMS later.

Figure 2:
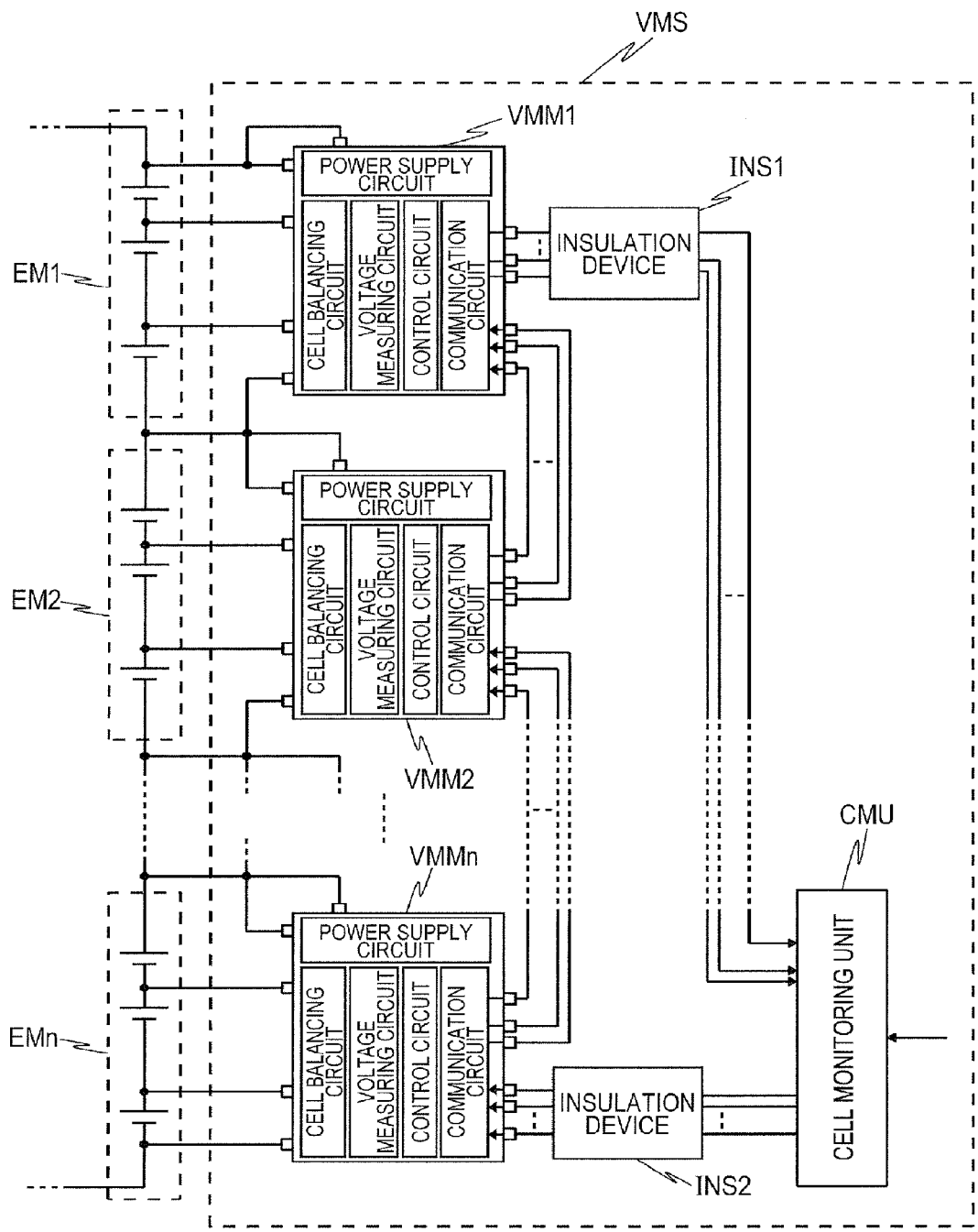
FIG. 2 is a block diagram showing couplings involving voltage monitoring modules and a cell monitoring unit.

Next, with reference to FIG. 2, the couplings involving the voltage monitoring modules VMM1 to VMMn and the cell monitoring unit CMU will be described. FIG. 2 is a block diagram of an essential portion of the voltage monitoring system VMS and shows the couplings involving the voltage monitoring modules VMM1 to VMMn and the cell monitoring unit CMU. The voltage monitoring modules VMM1 to VMMn are coupled to the battery modules EM1 to EMn, respectively, and monitor the voltages received from the battery modules EM1 to EMn. The voltage monitoring modules VMM1 to VMMn are coupled in a daisy-chain configuration with the communication circuit outputs of the voltage monitoring modules VMM2 to VMMn inputted to the communication circuits of the voltage monitoring modules VMM1 to VMM(n−1), respectively.

The cell monitoring unit CMU outputs a control signal to the voltage monitoring module VMMn via the insulation element INS2. The control signal is conveyed from the VMMn to the voltage monitoring modules VMM(n−1) to VMM1 making use of the daisy-chain configuration. This enables the cell monitoring unit CMU to control the operation of the voltage monitoring modules VMM1 to VMMn. The voltage monitoring modules VMM1 to VMMn output, responding to the control signal sent from the cell monitoring unit CMU, the results of voltage monitoring to the cell monitoring unit CMU via the insulation element INS1. The results of voltage monitoring by the voltage monitoring modules VMM2 to VMMn are conveyed to the cell monitoring unit CMU making use of the daisy-chain configuration.

Figure 3:
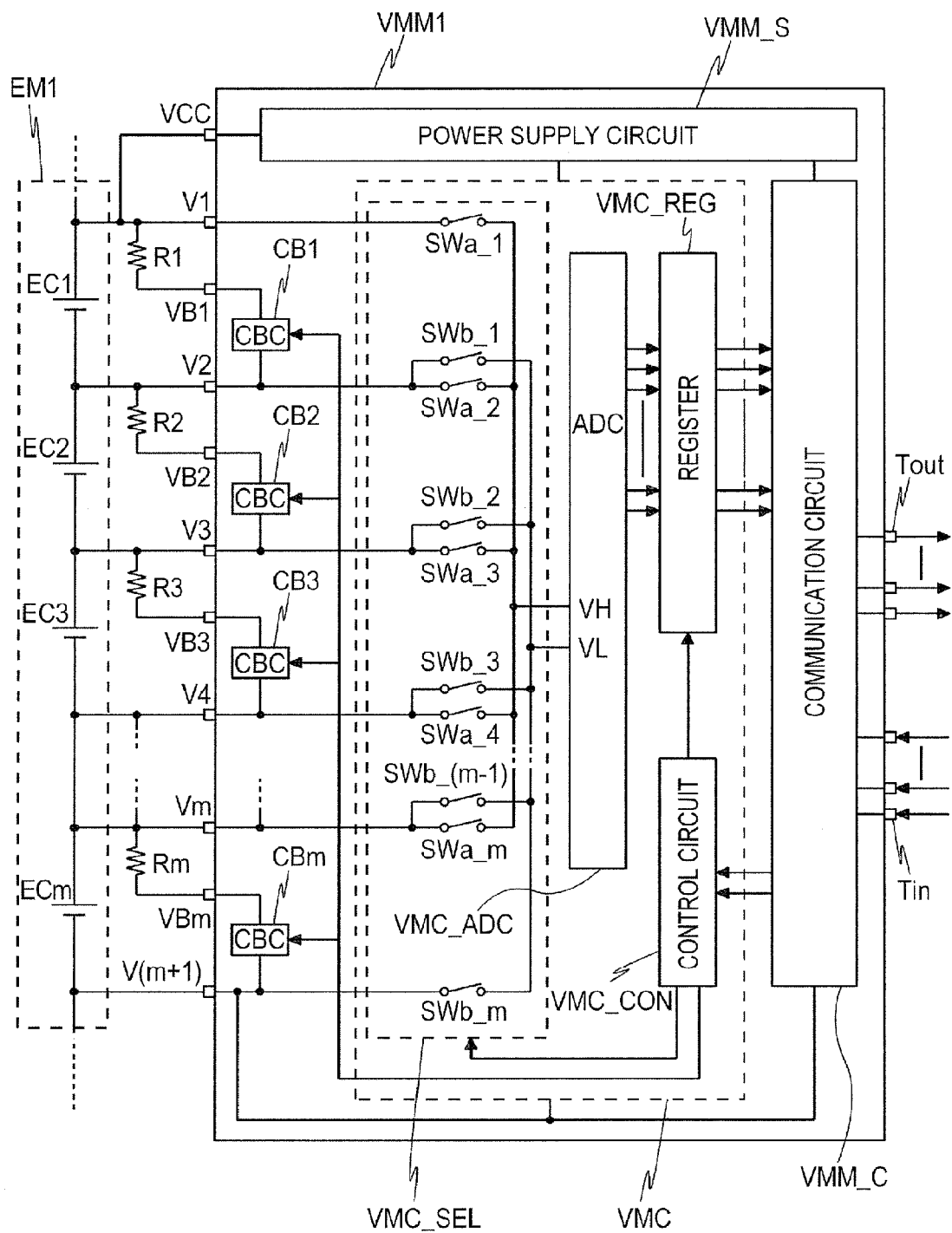
FIG. 3 is a block diagram showing a configuration of a voltage monitoring module.

Next, the configurations of the voltage monitoring modules VMM1 to VMMn will be described. Note that the voltage monitoring modules VMM1 to VMMn are identically configured. In the following, the configuration of the voltage monitoring module VMM1 will be described as a representative example with reference to FIG. 3. FIG. 3 is a block diagram showing the configuration of the voltage monitoring module VMM1. The voltage monitoring module VMM1 includes a power supply circuit VMM_S, a communication circuit VMM_C, a voltage measuring circuit VMC, cell balancing circuits CB1 to CBm (m being an integer of 2 or larger), a power supply terminal VCC, input terminals V1 to V(m+1), cell balancing input terminals VB1 to VBm, and communication input terminals Tin, and communication output terminals Tout.

The battery module EM1 includes battery cells EC1 to ECm series-coupled in that order with the EC1 on the highest-voltage side. The power supply terminal VCC of the voltage monitoring module VMM1 is coupled to the high voltage (positive electrode) side of the battery cell EC1. The low-voltage side of the battery cell ECm is coupled to the input terminal V(m+1). The voltage from the input terminal V(m+1) is branched in the voltage monitoring module VMM1 to be supplied as ground voltage to the voltage measuring circuit VMC and the communication circuit VMMC. This causes the output voltage of the battery module EM1 to be supplied as a supply voltage to the voltage monitoring module VMM1. The power supply circuit VMM_S has power supplied from the battery cell EC1 via the power supply terminal VCC. The power supply circuit VMM_S supplies power to the communication circuit VMM_C and the voltage measuring circuit VMC.

The voltage measuring circuit VMC includes a selection circuit VMC_SEL, an analog-to-digital converter (A/D Converter) VMC-ADC, a register VMC_REG, and a control circuit VMC_CON. The selection circuit VMC_SEL includes switches SWa_1 to SWa_m and switches Swb_1 to SWb_m. The switches SWa_1 to SWa_m and Swb_1 to SWb_m are turned on/off by control signals from the control circuit VMC_CON. To measure the voltage of a battery cell ECj (j being an integer in the range of 1 to m), switches SWa_j and SWb_j are simultaneously turned on. This causes the voltage from the high-potential terminal of the battery cell ECj to be supplied as a high potential voltage VH to the A/D converter VMC_ADC via the input terminal Vj. Similarly, the voltage from the low-potential terminal of the battery cell ECj is supplied as a low potential voltage VL to the A/D converter VMC_ADC via the input terminal V(j+1).

The A/D converter VMC_ADC converts the values of the high-potential voltage VH and low-potential voltage VL into digital voltage values and outputs the digital voltage values to the register VMC_REG. The register VMC_REG stores the voltage values outputted from the A/D converter VMC_ADC. The control circuit repeats, at a predetermined period (for example, every 10 ms), sequentially turning on the switches SWa_1 to SWa_m and Swb_1 to SWb_m. This causes the voltage values supplied from the input terminal Vj and V(j+1) to be periodically stored in the register VMC_REG thereby overwriting the previous voltage values.

The communication circuit VMM_C receives, via the communication input terminals Tin, commands from the cell monitoring unit CMU and data outputted from the other voltage Monitoring modules VMM2 to VMMn. When a command is received from the cell monitoring unit CMU, the communication circuit VMM_C transfers it to the control circuit VMC_CON. The communication circuit VMM_C transfers the data received from the voltage monitoring modules VMM2 to VMMn to the cell monitoring unit CMU as they are.

The cell balancing circuit CBj and an external resistor Rj are coupled between the input terminals Vj and V(j+1) via the cell balancing input terminal VBj. Turning on of the cell balancing circuit CBj electrically couples the input terminal Vj and the input terminal V(j+1). The control circuit VMC_CON controls turning on/off of the cell balancing circuits CB1 to CBm thereby selectively causing the battery cells EC1 to ECm to discharge.

Next, the operation of the voltage monitoring system VMS will be described with reference to FIG. 1. First, monitoring of the output voltage of each battery cell will be described. When a voltage monitoring operation starting command is received from the cell monitoring unit CMU, the voltage monitoring system VMS starts operation to monitor the output voltage of each battery cell. For example, the engine control unit ECU detects powering on of the electric vehicle and issues a command to start the voltage monitoring system VMS to the battery management unit BMU. When the command to start the voltage monitoring system VMS is received, the battery management unit BMU issues a command to start the voltage monitoring modules VMM1 to VMMn to the cell monitoring unit CMU. When the command to start the voltage monitoring modules VMM1 to VMMn is received, the cell monitoring unit CMU issues a voltage monitoring operation starting command to the voltage monitoring modules VMM1 to VMMn.

With reference to FIG. 3, the operation of the voltage monitoring modules VMM1 to VMMn will be described. When a voltage monitoring operation starting command is received, the voltage monitoring modules VMM1 to VMMn operate in a similar manner. In the following, the operation of the voltage monitoring module VMM1 will be described as a representative example. When a voltage monitoring operation starting command is received from the cell monitoring unit CMU, the voltage monitoring module VMM1 starts operation to monitor the voltage of each battery cell. To be more concrete, when a voltage monitoring operation starting command is received from the cell monitoring unit CMU, the communication circuit VMM_C transfers it to the control circuit VMC_CON of the voltage measuring circuit VMC. When the voltage monitoring operation starting command is received, the Control circuit VMC_CON turns the switches SWa_j and SWb_j on. This causes the input terminals Vj and V(j+1) to be coupled to the A/D converter VMC_ADC. The A/D converter VMC_ADC converts the magnitudes of voltages supplied to the input terminals Vj and V(j+1) coupled thereto into digital voltage values and writes the digital voltage values in the register VMC_REG.

In the present example, the control circuit VMC_CON turns the switches SWa_1 to SWa_m and SWb_1 to SWb_m in order in a predetermined length of time. Namely, the control circuit VMC_CON repeats switching operation m times within a predetermined length of time, for example, 10 ms. In this case, the voltage monitoring module VMM1 measures the voltages supplied to the input terminals Vj and V(j+1) at a predetermined period (every 10 ms) and writes the measured voltage values in the register VMC_REG. The voltage monitoring module VMM1 continues the voltage monitoring operation unless otherwise instructed by a command from the cell monitoring unit CMU.

When the output voltage of a battery cell is to be referred to for electric vehicle control, the cell monitoring unit CMU issues, in accordance with a command from the battery management unit BMU, a voltage value output command to the voltage monitoring module VMM1. The voltage monitoring module VMM1 then outputs, in accordance with the voltage value output command, the voltage values at the specified input terminals to the cell monitoring unit CMU. To be more concrete, the communication circuit VMM_C transfers the voltage value output command received from the cell monitoring unit CMU to the control circuit VMC_CON of the voltage measuring circuit VMC. Responding to the voltage value output command, the control circuit VMC_CON issues an output command, specifying the input terminals the voltage values at which are to be outputted, to the register VMC_REG. In response to the output command received from the control circuit VMC_CON, the register VMC_REG outputs the current voltage values at the specified input terminals to the cell monitoring unit CMU via the communication circuit VMM_C.

The cell monitoring unit CMU calculates the output voltage of the battery cell ECj based on the voltage values at the input terminals Vj and V(j+1) received from the voltage monitoring module VMM1. For example, the cell monitoring unit CMU can calculate the output voltage of the battery cell EC1 based on the voltage difference between the input terminals V1 and V2. When subsequently requested by the battery management unit BMU, the cell monitoring unit CMU notifies the calculated output voltage value of the battery cell to the battery management unit BMU.

When the electric vehicle is powered off, the engine control unit ECU detects the powering off of the electric vehicle and issues a command to stop the voltage monitoring system VMS to the battery management unit BMU. When the command to stop the voltage monitoring system VMS is received, the battery management unit BMU issues a command to stop the Voltage monitoring modules VMM1 to VMMn to the cell monitoring unit CMU. When the command to stop the voltage monitoring modules VMM1 to VMMn is received, the cell monitoring unit CMU issues a voltage monitoring operation stopping command to the voltage monitoring modules VMM1 to VMMn. When the voltage monitoring operation stopping command is received from the cell monitoring unit, the voltage monitoring module VMM1 stops voltage monitoring operation. To be more concrete, when a voltage monitoring operation stopping command is received from the cell monitoring unit CMU, the communication circuit VMM_C transfers the command to the control circuit VMC_CON of the voltage measuring circuit VMC. Responding to the voltage monitoring operation stopping command, the control circuit VMC_CON turns the switches SWa_1 to SWa_m and SWb_1 to SWb_m off. This stops voltage monitoring operation.

The operation to monitor battery cell voltages has been described above. Since, however, the voltage monitoring system VMS is mounted, for example, in an electric vehicle, it is required to operate based on the operating condition of the electric vehicle. In the following, the operation of the voltage monitoring system VMS based on the operating condition of an electric vehicle will be described.

To use an electric vehicle continuously, it is necessary to charge the assembled battery assy of the vehicle, for example, at a charging station. For example, when the driver of the vehicle couples a charging plug to charge the assembled battery assy, the engine control unit ECU detects the coupling of the charging plug and issues a command to charge the assembled battery assy to the battery management unit BMU. When the charging command is received from the engine control unit ECU, the battery management unit BMU opens relays REL1 and REL2. This electrically decouples the assembled battery assy from an inverter INV. In this state, supplying, for example, an external charging voltage CHARGE to the assembled battery assy via the charging plug charges the assembled battery assy.

Generally, it is known that overcharging or over-discharging a secondary battery such as a battery cell shortens the life of the battery cell. Also, in a battery configuration like that of the assembled battery assy in which plural battery cells are series-coupled, even if the plural battery cells are charged and discharged in a similar manner, their output voltages become uneven, for example, due to battery cell unevenness caused during manufacture. Repeatedly charging and discharging the assembled battery assy having such battery cell unevenness may result in degradation of only specific battery cells or may cause only specific battery cells to be overcharged or over-discharged. As a result, the life of the entire assembled battery assy may be shortened or the entire assembled battery may develop a fault. Hence, when using series-coupled battery cells, it is necessary to maintain voltage balance between the battery cells (so-called, cell.

In the following, the battery cell operation in the voltage monitoring system VMS at the time of battery charging, for example, at a charging station will be described. Since the operation performed to monitor the battery cell output voltages and the method of calculating battery cell output voltages are similar to the above-described, the description related with them will be appropriately omitted.

When a charging command is received from the engine control unit ECU, the battery management unit BMU issues an output voltage measuring command to the cell monitoring unit CMU. When the output voltage measuring command is received from the battery management unit BMU, the cell monitoring unit CMU calculates, in accordance with the command, the output voltages of all battery cells included in the assembled battery assy and notifies the calculation results to the battery management unit BMU. The battery management unit BMU identifies the battery cell whose output voltage is the lowest among all the battery Cells included in the assembled battery assy. For simplification of the following description, assume that, among all the battery cells included in the assembled battery assy, the battery cell EC1 of the battery module EM1 outputs the lowest voltage.

The battery management unit BMU subsequently issues a cell balancing command to the cell monitoring unit CMU. In response to the cell balancing command received from the battery management unit BMU, the cell monitoring unit CMU issues a discharging command to the voltage monitoring modules VMM1 to VMMn. In the following, the operation of the voltage monitoring module VMM1 as a representative example will be described. In the voltage monitoring module VMM1, the control circuit VMC_CON of the voltage measuring circuit VMC receives the discharging command via the communication circuit VMM_C. In accordance with the discharging command, the control circuit VMC_CON turns the cell balancing circuits CB2 to CBm on causing the battery cells EC2 to ECm to be discharged.

The cell monitoring unit CMU sequentially calculates the output voltage values of the battery cells EC2 to ECm that are discharging. When the output voltage of a battery cell drops to equal the output voltage of the battery cell EC1, the cell monitoring unit CMU issues a discharge stopping command to stop discharging of the battery cell. In the following, the operation performed when the output voltage of the battery cell EC2 drops to equal the output voltage of the battery cell EC1 will be described. When the cell monitoring unit CMU detects that the output voltage of the battery cell EC2 has dropped to equal the output voltage of the battery cell EC1, the cell monitoring unit CMU issues a discharge stopping command to stop discharging of the battery cell EC2 to the voltage monitoring module VMM1.

The control circuit VMC_CON of the voltage monitoring module VMM1 receives the discharge stopping command for the battery cell EC2 via the communication VMM_C and, in response to the command, turns the cell balancing circuit CB2 off. As a result, the battery cell EC2 stops discharging in a state with its output voltage equalized with the output voltage of the battery cell EC1. As the cell monitoring unit CMU performs the same operation for each of the battery cells EC3 to ECm included in the battery module EM1 and also for the battery cells included in each of the battery modules EM2 to EMn, the output voltage of each of the battery cells EM2 to EMn is eventually equalized with the output voltage of the battery cell EM1 in each of the battery modules EM2 to EMn. As a result, the output voltages of all battery cells in all battery modules EM1 to EMn are equalized causing the cell monitoring unit CMU to end cell balancing operation and notify the end of cell balancing operation to the battery management unit BMU.

In response to the notification of the end of cell balancing operation received from the cell monitoring unit CMU, the battery management unit BMU issues a charge starting command to a power receiving unit (not shown) coupled with a charging plug. As a result, an external, charging voltage CHARGE is supplied to the assembled battery assy to charge the assembled battery assy.

While the battery cells are being charged, the cell monitoring unit CMU monitors the output voltage of each battery cell. When the output voltage of any battery, cell reaches an upper-limit voltage for charging, the cell monitoring unit CMU sends an overcharge alarm to the battery management unit BMU. In response to the overcharge alarm, the battery management unit BMU issues a charge stopping command to the power receiving unit. As a result, the supply of the external charge voltage CHARGE is shut off causing charging of the assembled battery assy to be stopped. The upper limit voltage for charging is preferably set with an adequate margin so as to be adequately lower than the overcharge threshold voltage level to securely prevent the battery cells from being overcharged.

Since the charging characteristics of the battery cells included in the voltage modules EM1 to EMn are not uniform, the output voltage values of the battery cells that have been charged are not uniform. To grasp the output voltage variation among the battery cells, the cell monitoring unit CMU measures the output voltage of each battery cell and determines whether or not the output voltage variation among the battery cells is within a prescribed range. The cell monitoring unit CMU notifies the result of determination to the battery management unit BMU.

When the output voltage variation among the battery cells is not within the prescribed range, the battery management unit BMU orders the cell monitoring unit CMU to start cell balancing operation. When the cell balancing operation is finished, the battery management unit BMU orders the power receiving unit to start charging the assembled battery assy. When, on the other hand, the output voltage variation among the battery cells is within the prescribed range; the battery management unit BMU notifies the completion of charging to the engine control unit ECU. The engine control unit ECU then indicates the completion of charging of the assembled battery assy, for example, on a display device provided in front of the driver's seat. As described above, the assembled battery assy can be fully charged while the voltage monitoring system VMS monitors the output voltage of each battery cell so as to prevent overcharging and maintain a preferable cell balance.

Next, the operation performed to accelerate the electric vehicle will be described. For example, when the driver of the vehicle depresses the accelerator pedal to accelerate the Vehicle, the engine control unit ECU detects the pedal depression and issues an acceleration command to accelerate the electric vehicle to the inverter INV and the battery management unit BMU. When the acceleration command from the engine control unit ECU is received, the operation mode of the inverter INV is switched to DC-to-AC conversion mode. When the battery management unit BMU receives the acceleration command from the engine control unit ECU, the battery management unit BMU closes the relays REL1 and REL2. As a result, a DC voltage is supplied from the assembled battery assy to the inverter INV. The inverter INV converts the DC voltage into an AC voltage and supplies the AC voltage to a motor generator MG. The motor generator MG generates a driving force by being supplied with the AC voltage. The driving force generated by the motor generator MG is conveyed to the driving wheels of the electric vehicle, for example, via a drive shaft causing the electric vehicle to be accelerated.

As the electric, vehicle is accelerated, it consumes the power stored in the battery cells and, as result, the output voltages of the battery cells gradually lower. Hence, a measure to prevent the battery cells from being over-discharged is necessary. For this reason, while the electric vehicle is running, the voltage monitoring system VMS keeps monitoring the output voltage of each battery cell and, when the output voltage of any battery cell drops below an alarm level voltage, the cell monitoring unit CMU issues a voltage drop alarm to the battery management unit BMU. Responding to the voltage drop alarm, the battery management unit BMU issues a low battery level alarm for the assembled battery assy to the engine control unit ECU. The engine control unit ECU then displays a low battery level alarm for the assembled battery assy, for example, on a display device provided in front of the driver's seat so as to inform the driver that the battery cells may possibly be over-discharged. In this way, the voltage monitoring system VMS can urge the driver to take action, for example, stopping the electric vehicle so as to prevent the battery cells from being over-discharged.

If the electric vehicle is kept running without any action taken in response to the low battery level alarm for the assembled battery assy, the output voltages of the battery cells further lower. To prevent over-discharging of the battery cells, therefore, it is necessary to stop discharging of each battery cell. For example, when the output voltage of any battery cell drops below a prescribed emergency stop voltage level, the cell monitoring unit CMU issues an emergency stop alarm to the battery management unit BMU. The emergency stop voltage level is preferably set with an adequate margin so as to be adequately higher than an over-discharge threshold voltage level to securely prevent the battery cells from being over-discharged.

Responding to the emergency stop alarm received from the cell monitoring unit CMU, the battery management unit BMU effects emergency stop operation. To be more concrete, the battery management unit BMU opens the relays REL1 and REL2 causing the power supply from the assembled battery assy to the inverter INV to be shut off. As a result, the output voltages of the battery cells stop lowering. The battery management unit BMU notifies the execution of the emergency stop operation to the engine control unit ECU. The engine control unit ECU indicates that the emergency stop operation has been executed, for example, on a display device provided in front of the driver's seat. In this way, the battery cells are securely prevented from being over-discharged.

Next, the operation performed to decelerate the electric vehicle will be described. For example, when the driver of the vehicle depresses the brake pedal to decelerate the vehicle, the engine control unit ECU detects the pedal depression and issues a deceleration command to decelerate the electric vehicle to the inverter INV and the battery management unit BMU. When the deceleration command from the engine control unit ECU is received, the operation mode of the inverter INV is switched to AC-to-DC conversion mode. When the battery management unit BMU receives the deceleration command from the engine control unit ECU, the battery management unit BMU closes the relays REL1 and REL2. The motor generator MG generates power using the rotating force of tires conveyed thereto, for example, via a drive shaft. The rotational resistance generated by power generation is conveyed as a braking force to the driving wheels via the drive shaft. This causes the electric vehicle to decelerate. This braking method is generally referred to as regenerative braking. The AC voltage generated by regenerative braking is supplied to the inverter INV. The inverter INV converts the DC voltage supplied from the motor generator MG into a DC voltage and supplies the DC voltage to the assembled battery assy. In this way, the assembled battery assy is charged by the voltage recovered by means of regenerative braking.

As the assembled battery assy is charged by regenerative braking, the output voltage of each battery cell rises. Hence, a measure to prevent the battery cells from being overcharged is necessary. For this reason, while the electric vehicle is running, the voltage monitoring system VMS keeps monitoring the output voltage of each battery cell. When regenerative braking is started, the cell monitoring unit CMU determines whether or not the output voltage of each cell is equal to or below the upper limit voltage for charging. If the output voltage of any battery cell is higher than the upper limit voltage for charging, the cell monitoring unit CMU issues an overcharge alarm to the battery management unit BMU. In response to the overcharge alarm, the battery management unit BMU opens the relays REL1 and REL2, thereby preventing the assembled battery assy from being charged.

During the time when the battery cells are being charged by regenerative braking, too, the cell monitor unit CMU keeps monitoring the output voltage of each battery cell and, if any battery cell whose output voltage has reached the upper limit voltage for charging is detected, issues an overcharge alarm to the battery management unit BMU. Responding to the overcharge alarm, the battery management unit BMU opens the relays REL1 and REL2 to prevent the assembled battery assy from being charged. In this way, overcharging of the assembled battery assy can be prevented.

The operation of the voltage monitoring system VMS has been described above based on the premise that the output voltage of each battery cell can be normally detected. In reality, however, there are cases where the output voltages of the battery cells cannot be normally detected. For example, if the wiring between the voltage monitoring modules VMM1 to VMMn and the assembled battery assy is broken, the voltage at the wiring-broken portion abnormally decreases or increases making it impossible for the cell monitoring unit CMU to normally calculate battery cell voltages. When wiring breaks as described above, the voltage monitoring system VMS cannot achieve its purpose, i.e. cannot monitor the output voltages of the battery cells. It is, therefore, necessary to detect wiring breaks.

Hence, an allowable range of output voltage of each battery cell is stored in advance in the cell monitoring unit CMU. When the calculated output voltage value of any battery cell falls outside the allowable range, the cell monitoring unit CMU determines that wiring has been broken and notifies the wiring breakage to the battery management unit BMU. When the notification of the wiring breakage is received, the battery management unit BMU opens the relays REL1 and REL2 to electrically decouple the inverter INV and the assembled battery assy from each other. This prevents occurrence of an additional system fault. The battery management unit BMU notifies the wiring breakage to the engine control unit ECU. The engine control unit ECU then indicates the occurrence of the wiring breakage, for example, on a display device provided in front of the driver's seat thereby informing the driver of the wiring breakage. As described above, the voltage monitoring system VMS can detect occurrence of a wiring breakage.

The configuration and operation of the voltage monitoring system VMS described above are mere examples. For example, the cell monitoring unit CMU and the battery management Unit BMU may be integrated into one circuit block. Also, between the cell monitoring unit CMU and the battery management unit BMU, one may take over the functions performed by the other either entirely or partly. Furthermore, the cell monitoring unit CMU, the battery management unit BMU and the engine control unit ECU can be combined into one circuit block. The engine control unit ECU may either entirely or partly take over the functions performed by the cell monitoring unit CMU and the battery management unit BMU.

First Embodiment

A first embodiment of the present invention will be described in detail below with reference to drawings. The first embodiment will be described based on an arbitrary one of the voltage monitoring modules described above with reference to FIGS. 1 to 3. The voltage monitoring module will be described centering on its power supply circuit and voltage measuring circuit. Since the foregoing cell balancing circuits and the configuration related with the cell balancing circuits are not directly related with the first embodiment, they are omitted in the drawings being referred to in the following.

Figure 4:
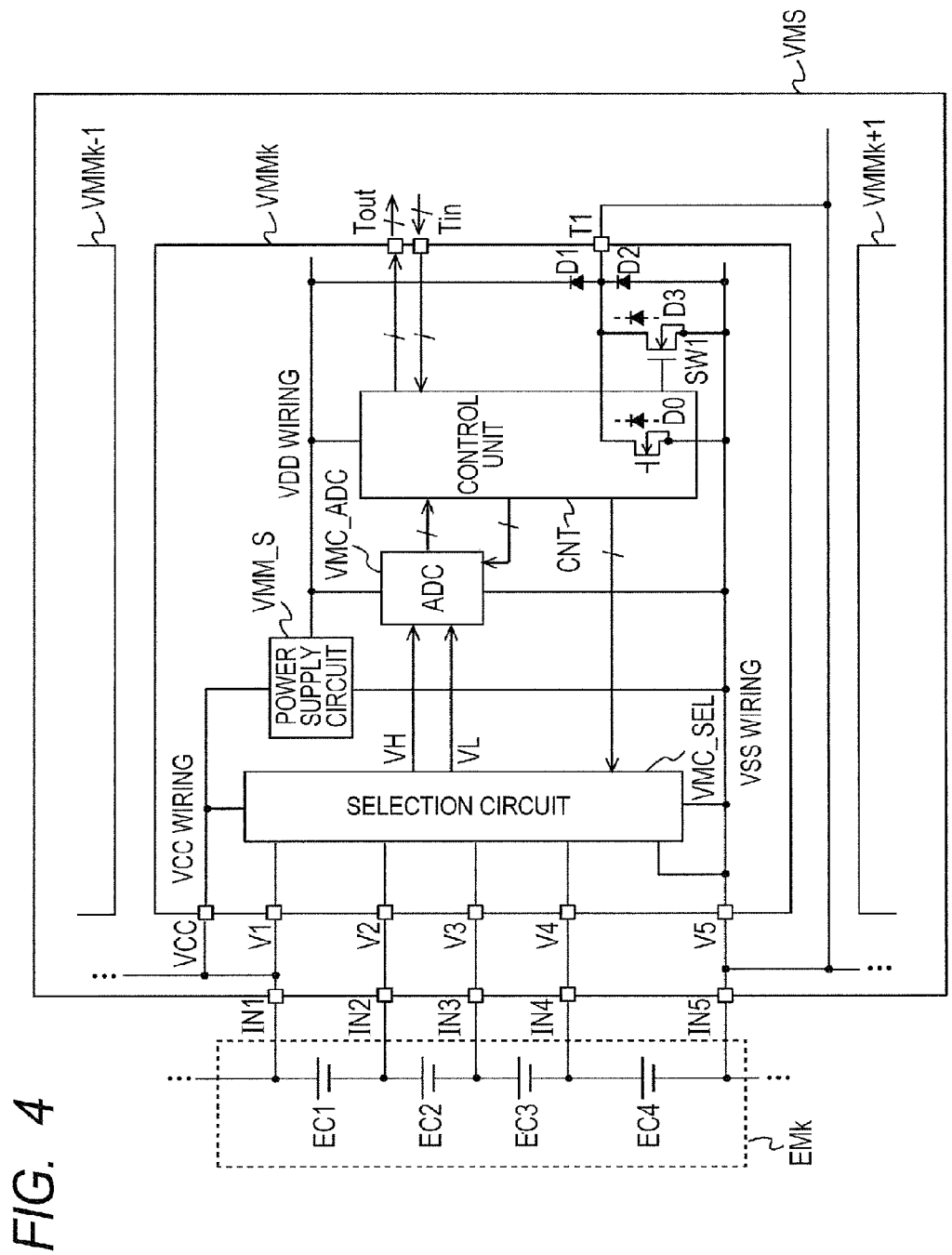
FIG. 4 shows the configuration of a voltage monitoring module according to a first embodiment of the present invention.

FIG. 4 shows the relationship between a voltage monitoring module VMMk (k being an arbitrary integer in the range of 1 to n) included in the voltage monitoring system VMS of the first embodiment and a corresponding battery module EMk.

As shown in FIG. 4, the voltage monitoring module VMMk includes a selection circuit VMC_SEL, a power supply circuit VMM_S an A/D converter (ADC) VMC_ADC, a control unit CNT, a switch circuit SW1, VCC wiring, VSS wiring, VDD wiring, Voltage input terminal's V1 to V5, a power supply terminal VCC, a communication input terminal Tin, a communication output terminal Tout, a terminal T1, and diodes D1 and D2 for ESD protection. Of the symbols shown in FIG. 4, those which are the same as those shown in FIGS. 1 to 3 represent configurations the same as or similar to the corresponding configurations shown in FIGS. 1 to 3. For the first embodiment, the registers VMC_REG, control circuit VMC_CON and communication circuit VMC_C that have been described with reference to FIG. 3 are combinedly represented as the control unit CNT for the sake of drawing simplification. Also for the sake of drawing simplification, the number of battery cells is set to four (EC1 to EC4) and, correspondingly, the number of voltage input terminals of the voltage monitoring module VMMk is set to five, i.e. V1 to V5. The voltage inputted via the voltage input terminal V5 serves as ground voltage for the voltage monitoring module VMMk. In the following, the voltage input terminal V5 will be referred to as the ground terminal V5 as required.

The battery module EMk includes the series-coupled battery cells EC1 to EC4. The power supply terminal VCC of the voltage monitoring module VMMk is coupled to the positive electrode side of the battery cell EC1 via the input terminal IN1 of the voltage monitoring system VMS. The voltage input terminal V5 (ground terminal V5) of the voltage monitoring module VMMk is coupled to the negative electrode side of the battery cell EC4 via the input terminal IN5 of the voltage monitoring system VMS. In this configuration, the output voltage of the battery module EMK is supplied as a supply voltage to the voltage monitoring module VMMk.

In the above configuration, the potential on the negative electrode side of the battery cell EC4 becomes the ground level of the voltage monitoring module VMMk and the potential on the positive electrode side of the battery cell EC1 becomes the supply voltage level of the voltage monitoring module VMMk.

The voltage input terminal V1 is coupled, together with the power supply terminal VCC, to the positive electrode side of the battery cell EC1 via the input terminal IN1 of the voltage monitoring system VMS. The voltage input terminal V2 is coupled to a coupling node between the battery cells EC1 and EC2 via the input terminal IN2 of the voltage monitoring system VMS. The voltage input terminal V3 is coupled to a coupling node between the battery cells EC2 and EC3 via the input terminal IN3 of the voltage monitoring system VMS. The voltage input terminal V4 is coupled to a coupling node between the battery cells EC3 and EC4 via the input terminal IN4 of the voltage monitoring system VMS.

The VCC wiring is coupled to the power supply terminal VCC to supply the voltage supplied from the power supply terminal VCC to the circuit in the voltage monitoring module VMMk. The VSS wiring is coupled to the ground terminal V5 to supply the voltage supplied from the ground terminal V5 to the circuit in the voltage monitoring module VMMk.

The selection circuit VMC_SEL receives voltages supplied from the voltage input terminals V1 to V4 and ground terminal V5 and, based on a selection control signal from the control unit CNT, selects two of the voltage input terminals V1 to V5, thereby selecting battery cell voltages and outputting the selected voltages to the A/D converter VMC_ADC as the output voltages VH and VL. For example, by selecting the voltage input terminals V4 and V5, the selection circuit VMC_SEL outputs the potential on the positive electrode side of the battery cell EC4 and the potential on the negative electrode side of the battery cell EC4 to the A/D converter VMC_ADC as the output voltages VH and VL, respectively. The selection circuit VMC_SEL is coupled between the VCC wiring and the VSS wiring.

The power supply circuit VMM_S is a regulator and is coupled between the VCC wiring and the VSS wiring. The power supply circuit VMM_S supplies the supply voltage VDD to the A/D converter VMC_ADC and the control unit CNT via the VDD wiring.

Figure 5:
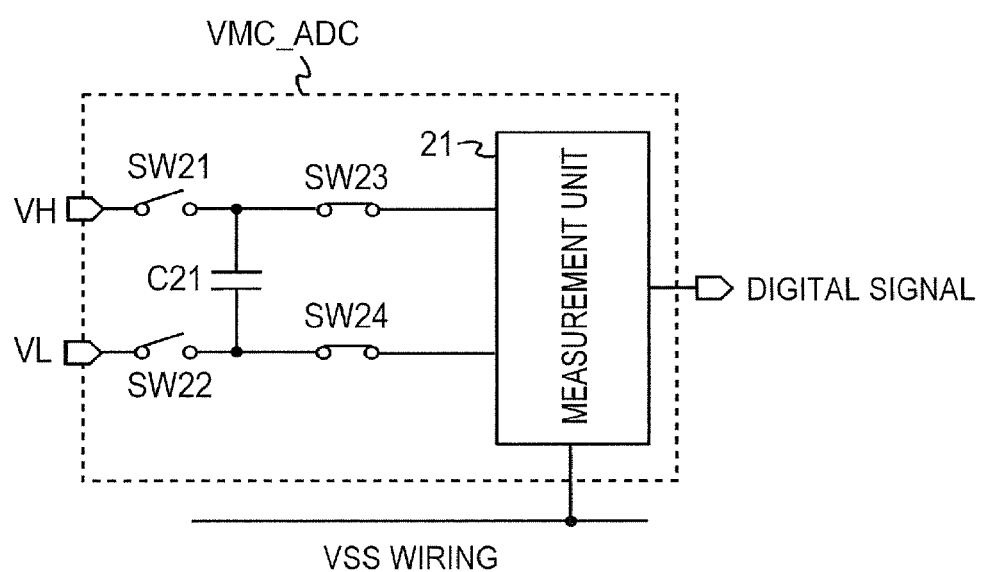
FIG. 5 shows the configuration of an A/D converter according to the first embodiment of the present invention.

The A/D converter VMC_ADC is coupled between the HDD wiring and the VSS wiring. The A/D converter VMC_ADC converts the potential difference between the output voltages VH and VL supplied from the selection circuit VMC_SEL into a digital signal to be outputted therefrom. To be more specific, the A/D converter VMC_ADC has a configuration, for example, as shown in FIG. 5. In the configuration, the A/D converter VMC_ADC includes, as shown in FIG. 5, switch circuits SW21 to SW24, a capacitor C21 and a measurement unit 21.

The switch circuit SW21 is coupled between the input terminal for inputting the voltage VH and one of the two terminals of the capacitor C21. The switch circuit SW22 is coupled between the input terminal for inputting the voltage VL and the other of the two terminals of the capacitor C21.

The switch circuit SW23 is coupled between one of the two terminals of the capacitor C21 and the measurement unit 21. The switch circuit SW24 is coupled between the other of the two terminals of the capacitor C21 and the measurement unit 21.

The control unit CNT performs control such that, when the switch circuits SW21 and SW22 are on, the switch circuits SW23 and SW24 are off and such that, when the switch circuits SW21 and SW22 are off, the switch circuits SW23 and SW24 are on.

When the switch circuits SW23 and SW24 are on, the measurement unit 21 measures the potential difference between the two ends of the capacitor C21 and outputs the potential difference after converting it into a digital signal.

The operation of the A/D converter VMC_ADC will be briefly described below. The A/D converter VMC_ADC first turns the switch circuits SW21 and SW22 on and the switch circuits SW23 and SW24 off, then applies the voltages VH and VL to the two ends of the capacitor C21 that has been discharged, respectively, thereby charging the capacitor C21.

Next, the A/D converter VMC_ADC turns the switch circuits SW21 and SW22 off, then turns the switch circuits SW23 and SW24 on. Though not shown, the A/D converter VMC_ADC has a discharging circuit for discharging the capacitor C21 and the capacitor C21 is discharged using the discharging circuit.

The above-described operation is repeated to convert the potential difference between the voltages VH and VL outputted from the selection circuit VMC_SEL into a digital signal and output the digital signal to the control unit CNT.

The terminal T1 is, for example, an address setting terminal of the voltage monitoring module VMMk and is used to set a low level value "0". Hence, it is coupled to the negative electrode side of the battery cell EC4 from which the ground level voltage for the voltage monitoring module VMMk is supplied. To be more specific, the terminal T1 is coupled to the negative electrode side of the battery cell EC4 via the input terminal IN5 on the circuit substrate side of the voltage monitoring system VMS and wiring on the circuit substrate.

Since the voltage monitoring system VMS has plural voltage monitoring modules, the cell monitoring unit CMU is required to identify the voltage monitoring module to communicate with. Each voltage monitoring module has an identification address set for it. For example, when setting address "011" as the identification address of the voltage monitoring module VMMk to be identified by the cell monitoring unit CMU, two address setting terminals are coupled, each to set "1", to the supply voltage VDD of the control unit CNT and one address setting terminal, i.e. the terminal T1 in the present example, is coupled, to set "0", to the negative electrode side (ground level) of the battery cell EC4.

Regardless of whether the terminal T1 is an address setting terminal as described above, in cases where the terminal T1 is kept coupled to the ground level of the voltage monitoring module VMMk, its terminal type is not defined. Generally, there are cases in which, to stabilize IC chip operation, unused terminals of an IC chip are terminated at a low level (ground level), that is, for example, unused terminals are coupled to the ground level of the voltage monitoring module VMMk on the circuit substrate. The terminal T1 may be a terminal which is terminated, as described above, at a low level (ground level).

The terminal T1 is coupled with diodes D1 and D2 for ESD protection. The diode D1 for ESD protection has a cathode coupled to the VDD wiring and an anode coupled to the terminal T1. The diode D2 for ESD protection has an anode coupled to the terminal T1 and a cathode coupled to the VSS wiring. The forward voltage of each of the diodes D1 and D2 for ESD protection is about 0.6 V, the same as that of general diodes.

The switch circuit SW1 is coupled between the terminal T1 and the VSS wiring and is turned on/off by switch control signals from the control unit CNT. The switch circuit SW1 is comprised of an NMOS transistor.

As described above, the control unit CNT has the communication circuit VMC_C and, when a voltage monitoring operation starting command is received from the cell monitoring unit CMU, controls the selection circuit VMC_SEL. As described with reference to FIG. 5, the control unit CNT controls the switch circuits of the A/D converter VMC_ADC. Also, the control unit CNT controls turning on/off of the switch circuit SW1 in accordance with test commands received from the cell monitoring unit CMU.

Furthermore, the control unit CNT is coupled to the terminal T1. This is because, with the terminal T1 being an address setting terminal for identifying the voltage monitoring module VMMk of the cell monitoring unit CMU as described above, the control unit CNT to communicate with the cell monitoring unit CMU is required to obtain the value ("0" in the present example) set by the address setting terminal T1.

The control unit CNT is a logic circuit comprised of plural NMOS transistors and PMOS transistors. Hence, for the voltage signal that is inputted from the address setting terminal T1 to the control unit CNT, an NMOS transistor is coupled on the VSS wiring side of the control unit CNT. Normally, an NMOS transistor unavoidably has a parasitic diode coupled between its back gate and drain. The forward voltage of the parasitic diode is about 0.6 V, the same as that of ordinary diodes. In FIG. 4, the parasitic diode is denoted by "D0". The NMOS transistor of which the switching circuit SW1 is comprised also has a parasitic diode, D3, coupled between its back gate and drain.

Figure 6:
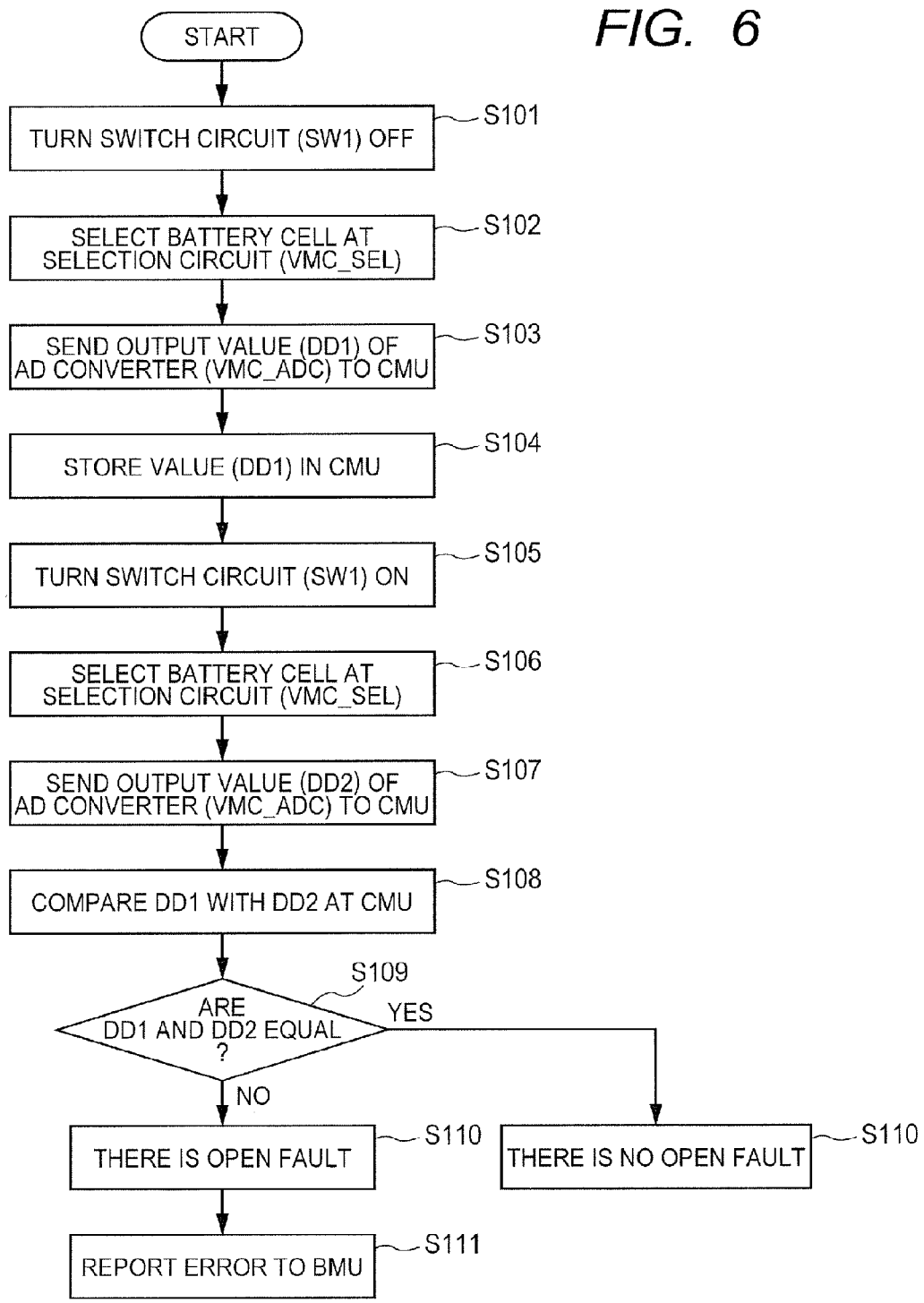
FIG. 6 is an operation flowchart for explaining the operation of the voltage monitoring module according to the first embodiment of the present invention.

In the following, the operation of the voltage monitoring module VMMk of the first embodiment outlined above will be described. FIG. 6 shows an operation flowchart for the voltage monitoring module VMMk. As shown in FIG. 6, the control unit CNT turns the switch circuit SW1 off (non-conducting) in accordance with a test command from the cell monitoring unit CMU (S101). Next, in accordance with a voltage monitoring operation starting command from the cell monitoring unit CMU, the control unit CNT causes the selection circuit VMC_SEL to select the voltage across one battery cell (battery cell EC4, for example) (S102). Next, the A/D converter VMC_ADC converts the battery cell voltage into a digital value DD1, then the control unit CNT sends the digital value DD1 to the cell monitoring unit CMU (S103). The cell monitoring unit CMU stores the digital value DD1 (S104).

Next, The control unit CNT turns the switch circuit SW1 on (conducting) in accordance with a test command from the cell monitoring unit CMU (S105). The control unit CNT then causes the selection circuit VMC_SEL to select the voltage across the same battery cell (battery cell EC4, for example) as the one selected in step S102 in according with a voltage monitoring operation starting command from the cell monitoring unit CMU (S106). Next, the A/D converter VMC_ADC converts the battery cell voltage into a digital value DD2, then the control unit CNT sends the digital value DD2 to the cell Monitoring unit CMU (S107).

The cell monitoring unit CMU compares the digital values DD1 and DD2 stored in the cell monitoring unit CMU (S108). When the digital values DD1 and DD2 are equal (S109=YES), it is determined that there is no open fault at the ground terminal V5 of the voltage monitoring module VMMk (S112).

When the digital values DD1 and DD2 are not equal (S109=NO), the cell monitoring unit CMU determines that there is an open fault at the ground terminal V5 of the voltage monitoring module VMMk (S110) and an error report is sent from the cell monitoring unit CMU to the battery management unit BMU (S111).

In steps S102 and S106, battery cells may be selected sequentially out of the battery cells EC1 to EC4 shown in FIG. 4 or the battery cell EC4 may be selected in both steps.

Figure 7:
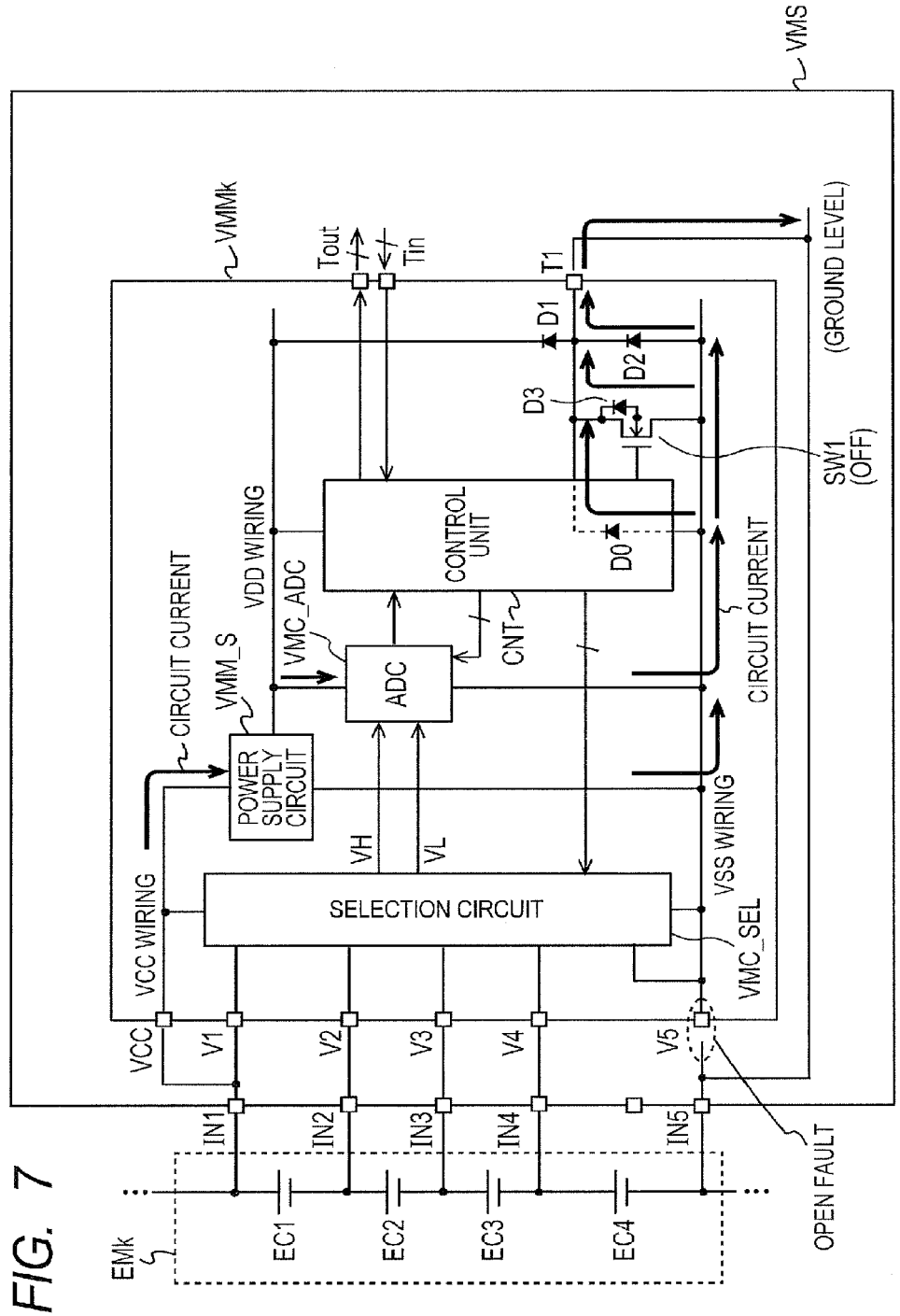
FIG. 7 is a mimic diagram for explaining the operation of the voltage monitoring module according to the first embodiment of the present invention.
Figure 8:
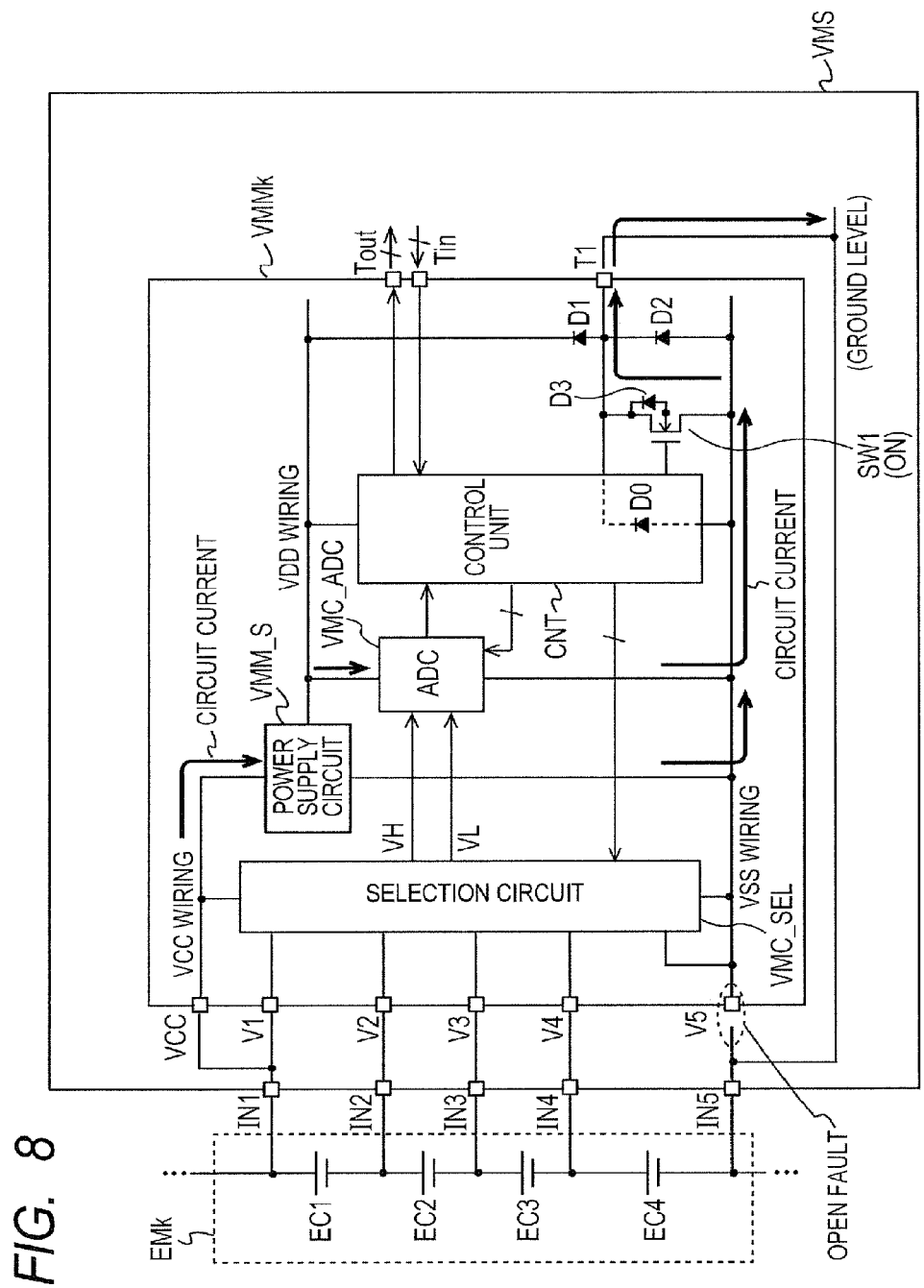
FIG. 8 is a mimic diagram for explaining the operation of the voltage monitoring module according to the first embodiment of the present invention.
Figure 9:
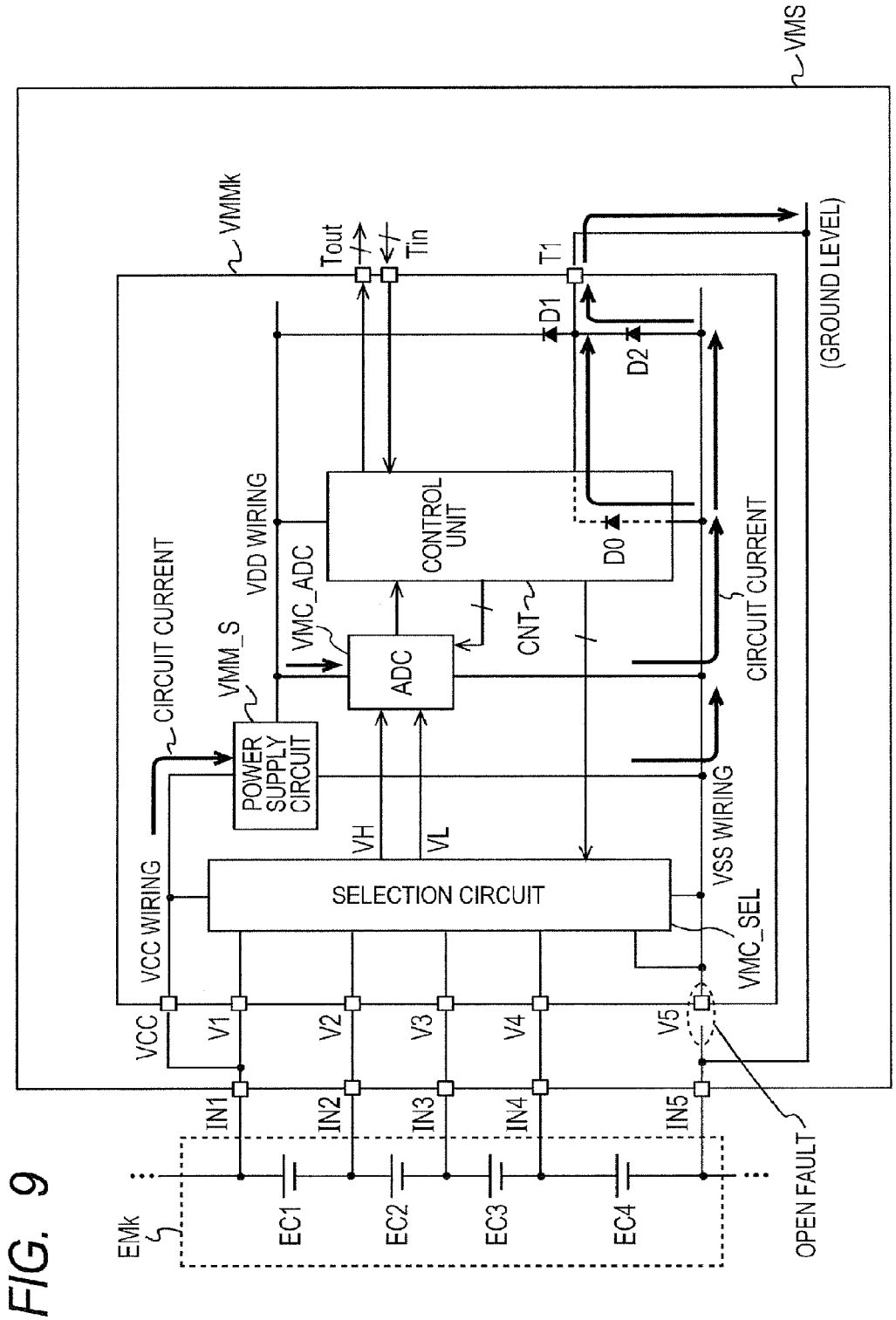
FIG. 9 is a mimic diagram for explaining the operation of an existing voltage monitoring module.

In the following, the states of the voltage monitoring module VMMk of the first embodiment during the above-described operation will be described with reference to FIGS. 7 to 9. FIGS. 7 to 9 shows example states of the voltage monitoring module VMMk with the ground terminal V5 having an open fault due to, for example, a contact failure or a terminal breakage. As for the terminal T1, it is coupled to the ground level by wiring on the circuit substrate, so that it is kept at the ground level even when the ground terminal VSS is left in an open state.

First, in step S101 shown in FIG. 6, the switch circuit SW1 enters an off state as shown in FIG. 7. When, with the switch circuit SW1 in the off state and the ground terminal V5 having an open fault, the voltage monitoring module VMMk operates, the circuit current flows out, as shown in FIG. 7, from the terminal T1 coupled to the ground level of the voltage monitoring module VMMk via the parasitic diodes D0 and D3 and the diode D2 for ESD protection without flowing through the ground terminal V5.

At this time, the potential of the VSS wiring increases, relative to the ground level of the voltage monitoring module VMMk, by a value equivalent to the voltage across a diode, for example, about 600 mV. Based on the potential increased by about 600 mV of the VSS wiring, the A/D converter VMC_ADC converts the voltage of the battery cell EC4 into a digital value and outputs the digital value as DD1. The digital value DD1 is about 600 mV smaller than a corresponding value in a normal state with no open fault at the ground terminal V5. The digital value DD1 is sent to the cell monitoring unit CMU t be stored there as described for steps S103 and S104 shown in FIG. 6.

Next, in step S105 shown in FIG. 6, the switch circuit SW1 is turned on as shown in FIG. 8. When, in this state with the ground terminal V5 having an open fault, the voltage monitoring module VMMk operates, the circuit current, similarly to the case shown in FIG. 7, does not flow through the ground terminal V5. In this case with the switch circuit SW1 being on, the circuit current flows out, as shown in FIG. 8, from the terminal T1 coupled to the ground level of the voltage monitoring module VMMk via the switch circuit SW1 without flowing through the parasitic diodes D0 and D3 and the diode D2 for ESD protection.

At this time, the potential of the VSS wiring increases, relative to the ground level of the voltage monitoring module VMMk, only by a value equivalent to the voltage drop caused by the on-resistance of an NMOS transistor, for example, about 100 mV. Based on the potential increased by about 100 mV of the VSS wiring, the A/D converter VMC_ADC converts the voltage of the battery cell EC4 into a digital value and outputs the digital value as DD2. The digital value DD2 is about 100 mV smaller than a corresponding value in a normal state with no open fault at the ground terminal V5. The digital value DD2 is sent to the cell monitoring unit CMU as described for step S107 shown in FIG. 6.

Subsequently, the digital values DD1 (about 600 mV smaller than a normal value) and DD2 (about 100 mV smaller than a normal value) are compared consequently causing the cell monitoring unit CMU to determine, based on the difference of about 500 mV between DD1 and DD2, that the ground terminal V5 has an open fault. As a result, the cell monitoring unit CMU sends an error report notifying of the open fault to the battery management unit BMU.

In cases where the ground terminal V5 has no open fault, the circuit current normally flows through the ground terminal V5 whether the switch circuit SW1 is off or on. This equalizes the potential of the VSS wiring with the ground level whether the switch circuit SW1 is off or on, so that the digital values DD1 and DD2 representing the potential difference across the battery cell EC4 outputted from the A/D converter VMC_ADC remain unchanged. As a result, the cell monitoring unit CMU determines that the ground terminal V5 has no open fault.

FIG. 9 shows a configuration of the voltage monitoring module VMMk having no switch circuit SW1. In this configuration, when the voltage monitoring module VMMk operates, the circuit current flows out from the terminal T1 coupled to the ground level of the voltage monitoring module VMMk via the parasitic diode D0 and the diode D2 for ESD protection without flowing through the ground terminal V5 having an open fault.

This is similar to the example described in the foregoing with reference to FIG. 7. Namely, the potential of the VSS wiring increases, relative to the ground level of the voltage monitoring module VMMk, by a value equivalent to the voltage across a diode, for example, about 600 mV. Based on the potential increased by about 600 mV of the VSS wiring, the A/D converter VMC_ADC converts the voltage across the battery cell EC4 into a digital value and outputs the digital value as DD1. The digital value DD1 is about 600 mV smaller than a corresponding value in a normal state with no open fault at the ground terminal V5.

When the voltage monitoring module VMMk has no switch circuit SW1, however, it is not possible to determine, as done in the present embodiment, whether or not the digital value DD1 outputted by the A/D converter VMC AD is accurate. This causes the voltage monitoring module VMMk to send the digital value inclusive of an error to the cell monitoring unit CMU. The cell monitoring unit CMU then adjusts the cell balancing circuit based on the digital value inclusive of an error. When the assembled battery assy is charged in such a state with the cell balance adjusted based on an erroneous value, the battery cell EC4 may possibly be overcharged. When the battery cell EC4 is overcharged, a battery system fault or quality deterioration may result as in cases where an existing technique is used.

In the present embodiment with the voltage monitoring module VMMk having the switch circuit SW1, the digital values outputted by the A/D converter VMC_ADC when the switch circuit SW1 is on and when the switch circuit SW1 is off, respectively, are compared thereby making it possible to determine whether or not the ground terminal V5 has an open fault. Hence, problems of a battery system fault or quality deterioration caused by overcharging of a battery cell resulting from an undetected open fault of a ground terminal as occurring in cases where an existing technique is used or where a configuration like the one shown in FIG. 7 is used can be prevented. Thus, according to the present embodiment, the reliability of the battery system as a whole can be improved.

Second Embodiment

A second embodiment of the present invention will be described in detail below with reference to drawings. The second embodiment will be described, similarly to the first embodiment, based on an arbitrary one of the voltage monitoring modules described above with reference to FIGS. 1 to 3. The voltage monitoring module will be described centering on its power supply circuit and voltage measuring circuit. Since the foregoing cell balancing circuits and the configuration related with the cell balancing circuits are not directly related with the second embodiment, they are omitted in the drawings being referred to in the following.

Figure 10:
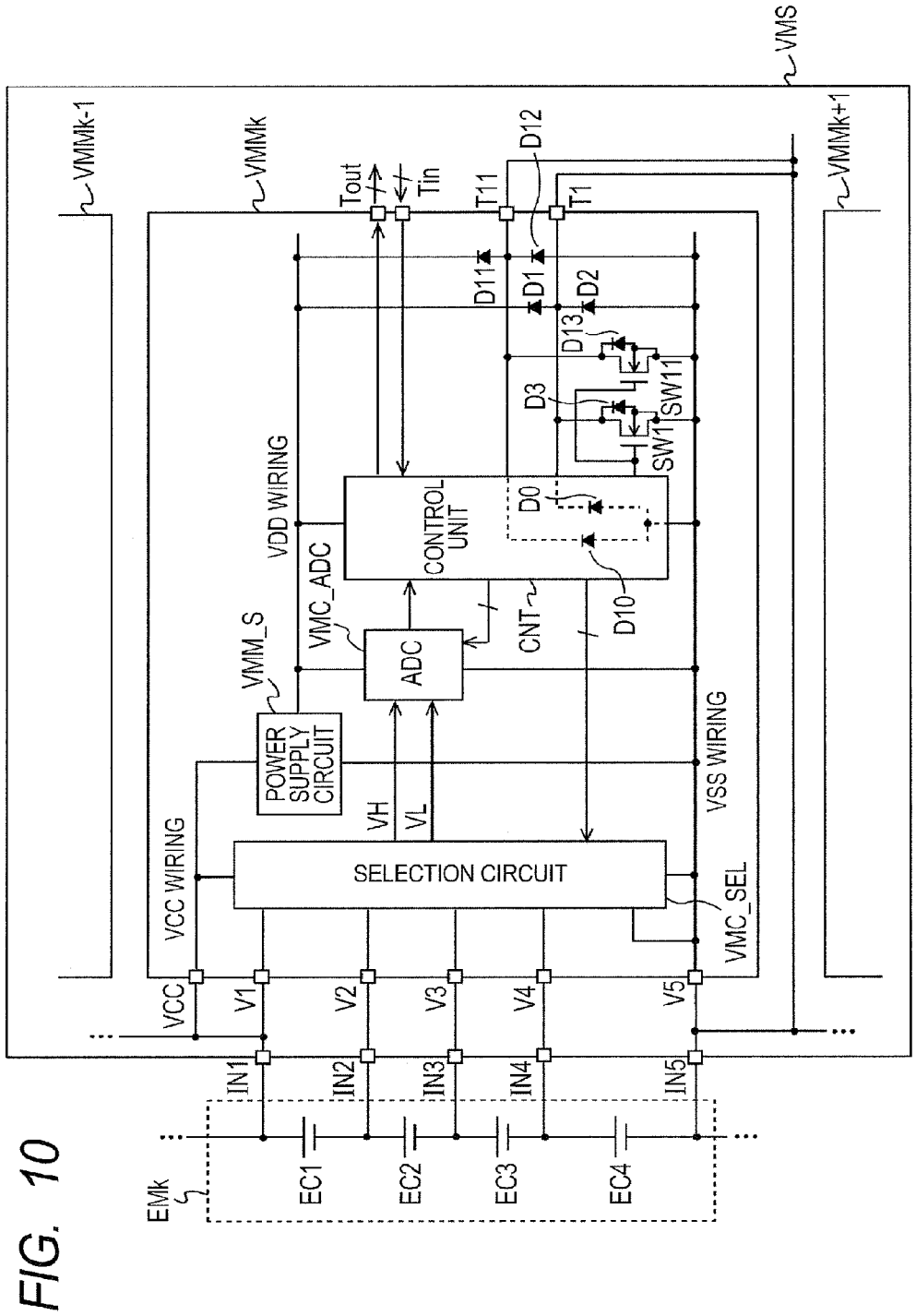
FIG. 10 shows the configuration of a voltage monitoring module according to a second embodiment of the present invention.

FIG. 10 shows the relationship between a voltage monitoring module VMMk (k being an arbitrary integer in the range of 1 to n) included in the voltage monitoring system VMS of the second embodiment and a corresponding battery module EMk. For the second embodiment, too, as done for the first embodiment, the registers VMC_REG, control circuit VMC_CON and communication circuit VMC_C that have been described with reference to FIG. 3 are combinedly represented as the control unit CNT for the sake of drawing simplification and the number of battery cells is set to four (EC1 to EC4).

As shown in FIG. 10, the voltage monitoring module VMMk includes a selection circuit VMC_SEL, a power supply circuit VMM_S, an A/D converter (ADC) VMC_ADC, a control unit CNT, switch circuits SW1 and SW11, VCC wiring, VSS wiring, VDD wiring, voltage input terminals V1 to V5, a power supply terminal VCC, a communication input terminal Tin, a communication output terminal Tout, terminals T1 and T11, and diodes D1, D2, D11 and D12 for ESD protection.

Of the symbols shown in FIG. 10, those which are the same as those shown in FIG. 4 represent configurations the same as or similar to the corresponding configurations shown in FIG. 4. The second embodiment differs from the first embodiment in that the voltage monitoring module VMMk of the second embodiment has the switch circuit SW11 and terminal T11 not included in the voltage monitoring module VMMk of the first embodiment. The following description will be focused on the difference between the first and second embodiments and the description of parts of the second embodiment identical with those of the first embodiment will be omitted.

The switch circuit SW11 is coupled between the terminal T11 and the VSS wiring and is turned on/off, like the switch circuit SW1, by switch control signals from the control unit CNT. The switch circuit SW11 is comprised of an NMOS transistor.

The terminal T11 like the terminal T1 is, for example, an address setting terminal of the voltage monitoring module VMMk and is used to set a low level value "0". Hence, it is coupled, via the input terminal IN5 on the circuit substrate side where the voltage monitoring modules are mounted, to the negative electrode side of the battery cell EC4 from which the ground level of the voltage monitoring module VMMk is supplied. Alternatively, the terminal T11 may be one terminated, as an unused terminal, at a low level (ground level) as described in connection with the terminal T1 of the first embodiment.

The terminal T11, like the terminal T1, is coupled with the diodes D11 and D12 for ESD protection. The diode D11 for ESD protection has a cathode coupled to the VDD wiring and an anode coupled to the terminal T11. The diode D12 for ESD protection has an anode coupled to the terminal T11 and a cathode coupled to the VSS wiring.

The control unit CNT, like in the first embodiment, controls the selection circuit VMC_SEL in accordance with a voltage monitoring operation starting command from the cell monitoring unit CMU. The control unit CNT also controls the switch circuits of the A/D converter VMC_ADC. Furthermore, the control unit CNT controls turning on/off of the switch circuits SW1 and SW11 in accordance with test commands from the cell monitoring unit CMU.

The control unit CNT is coupled to the terminals T1 and T11. This is because, with the terminals T1 and T11 being address setting terminals for identifying the voltage monitoring module VMMk of the cell monitoring unit CMU as described above, the control unit CNT to communicate with the cell monitoring unit CMU is required to obtain the value ("0" in the present example) set by each of the address setting terminals T1 and T11.

The control unit CNT is a logic circuit comprised of plural NMOS transistors and PMOS transistors. Hence, for the voltage signals inputted from the address setting terminals T1 and T11 to the control unit CNT, NMOS transistors are coupled on the VSS wiring side of the control unit CNT. The NMOS transistors have parasitic diodes as also described in connection with the first embodiment. The parasitic diodes included in the control unit CNT corresponding to the terminals T1 and T11 are denoted by "D0" and "D10" in FIG. 10. The NMOS transistor of which the switch circuit SW11 is comprised also has a parasitic diode denoted by "D13".

In the following, the states of the voltage monitoring module VMMk of the second embodiment during the above-described operation will be described. The flow of operation of the voltage monitoring module VMMk is the same as described based on FIG. 6 for the first embodiment, so that its description is appropriately omitted in the following.

First, in step S101 shown in FIG. 6, the switch circuits SW1 and SW11 are turned off. When, in this state, the voltage monitoring module VMMk operates, the circuit current flows out, as in the first embodiment, from the terminals T1 and T11 coupled to the ground level via the parasitic diodes D0, D10, D3 and D13 and the diodes D2 and D12 for ESD protection without flowing through the ground terminal V5 having an open fault.

At this time, as in the first embodiment, the potential of the VSS wiring increases, relative to the ground level of the voltage monitoring module VMMk, by a value equivalent to the voltage across a diode, for example, about 600 mV. Based on the potential increased by about 600 mV of the VSS wiring, the A/D converter VMC_ADC converts the voltage of the battery cell EC4 into a digital value and outputs the digital value as DD1. The digital value DD1 is about 600 mV smaller than a corresponding value in a normal state with no open fault at the ground terminal V5. The digital value DD1 is sent to the cell monitoring unit CMU to be stored there as described for steps S103 and S104 shown in FIG. 6.

Next, in step S105 shown in FIG. 6, the switch circuit SW1 is turned on. When, in this state with the ground terminal V5 having an open fault, the voltage monitoring module VMMk operates, the circuit current does not flow through the ground terminal V5. In this case with the switch circuits SW1 and SW11 being on, the circuit current flows out from the terminals T1 and T11 coupled to the ground level of the voltage monitoring module VMMk via the switch circuits SW1 and SW11.

At this time, the potential of the VSS wiring increases, relative to the ground level of the voltage monitoring module VMMk, only by a value equivalent to the voltage drop caused by the composite on-resistance of the NMOS transistors making up the switch circuits SW1 and SW11, for example, by about 50 mV. Based on the potential increased by about 50 mV of the VSS wiring, the A/D converter VMC_ADC converts the voltage of the battery cell EC4 into a digital value and outputs the digital value as DD2. The digital value DD2 is about 50 mV smaller than a corresponding value in a normal state with no open fault at the ground terminal V5. The digital value DD2 is sent to the cell monitoring unit CMU as described for step S107 shown in. FIG. 6. Subsequently, the digital values DD1 (about 600 mV smaller than a normal value) and DD2 (about 50 mV smaller than a normal value) are compared consequently causing the cell monitoring unit CMU to determine, based on the difference of about 550 mV between DD1 and DD2, that the ground terminal V5 has an open fault. As a result, the cell monitoring unit CMU sends an error report notifying of the open fault to the battery management unit BMU.

In cases where the ground terminal V5 has no open fault, the circuit current normally flows through the ground terminal V5 whether the switch circuits SW1 and SW11 are off or on. This equalizes the potential of the VSS wiring with the ground level whether the switch circuits SW1 and SW11 are off or on, so that the digital values DD1 and DD2 outputted from the A/D converter VMC_ADC do not change. As a result, the cell monitoring unit CMU determines that the ground terminal V5 has no open fault.

As described above, in the second embodiment with the voltage monitoring module VMMk having the switch circuits SW1 and SW11, the digital values outputted by the A/D converter VMC_ADC. when the switch circuits SW1 and SW11 are on and when the switch circuits SW1 and SW11 are off, respectively, are compared and, based on the comparison result, whether or not the ground terminal V5 has an open fault is determined. In the second embodiment, the plural switch circuits (NMOS transistors) coupled to the ground level are coupled in parallel, so that the composite on-resistance of the switch circuits SW1 and SW11 in an on-state is approximately halved. Hence, the voltage drop corresponding to the composite resistance is about half as small as the voltage drop in the first embodiment.

Compared with the first embodiment, therefore, the difference between the digital values outputted from the A/D converter VMC_ADC when the switch circuits SW1 and SW11 are on and when the switch circuits SW1 and SW11 are off, respectively, is large. Hence, when the ground terminal V5 has an open fault, the open fault can be securely detected. This makes it possible to further improve the reliability of the battery system as a whole.

Even though, in the above example, the two switch circuits SW1 and SW2 are used, more switch circuits may be used. When as many as p switch circuits are used, the voltage drop corresponding to the composite resistance of the p switch circuits in an on-state is reduced to about 1/p relative to the corresponding voltage drop in the first embodiment. Hence, the difference between the digital values outputted from the A/D converter VMC_ADC when the switch circuits SW1 and SW11 are on and when the switch circuits SW1 and SW11 are off, respectively, become larger. This makes it possible, when the ground terminal V5 has an open fault, to more securely detect the open fault.

Third Embodiment

A third embodiment of the present invention will be described in detail below with reference to drawings. The third embodiment will be described, similarly to the first embodiment, based on an arbitrary one of the voltage monitoring modules described above with reference to FIGS. 1 to 3. The voltage monitoring module will be described centering on its power supply circuit and voltage measuring circuit. Since the foregoing cell balancing circuits and the configuration related with the cell balancing circuits are not directly related with the third embodiment, they are omitted in the drawings being referred to in the following.

Figure 11:
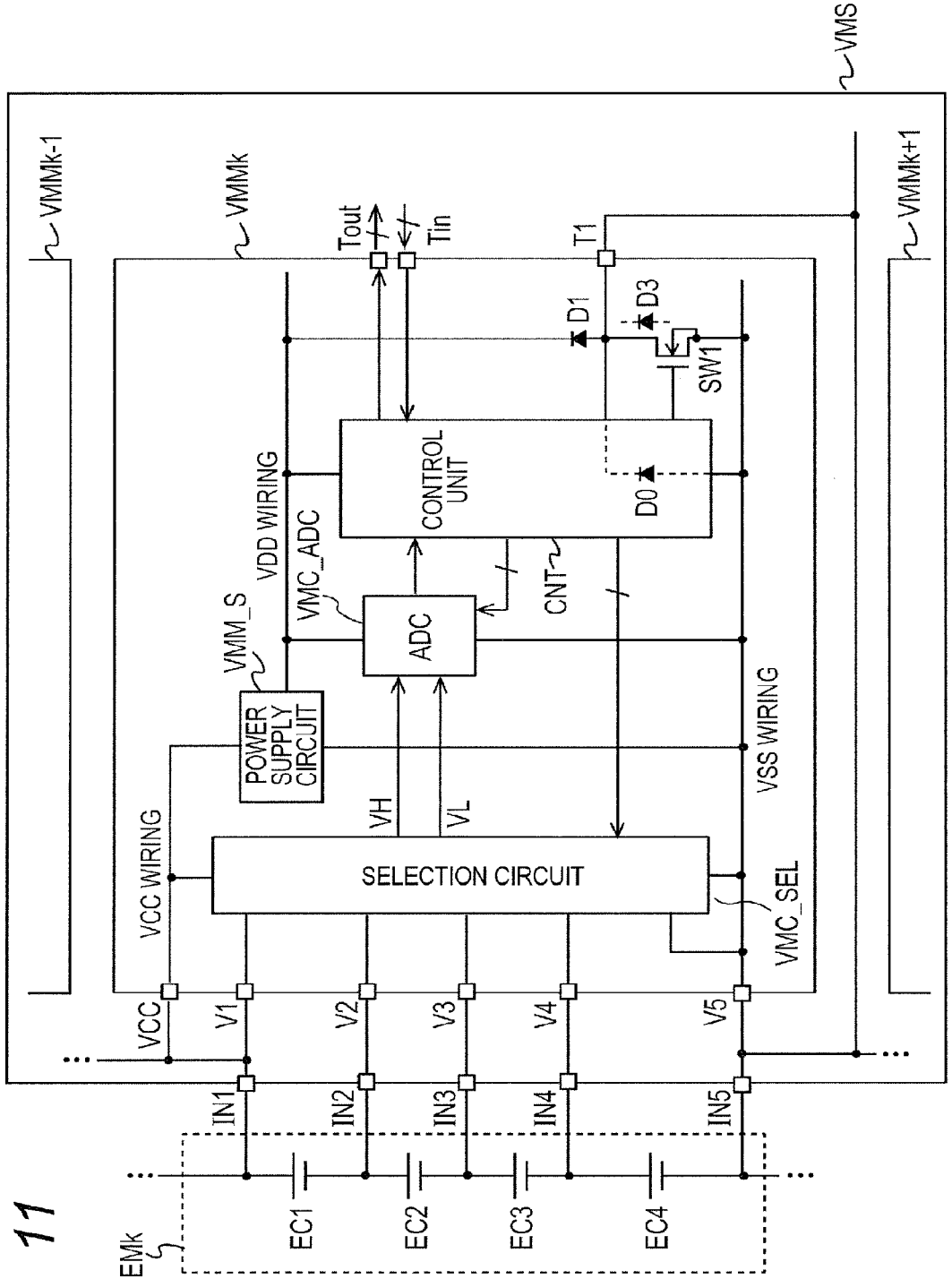
FIG. 11 shows the configuration of a voltage monitoring module according to a third embodiment of the present invention.
Figure 12:
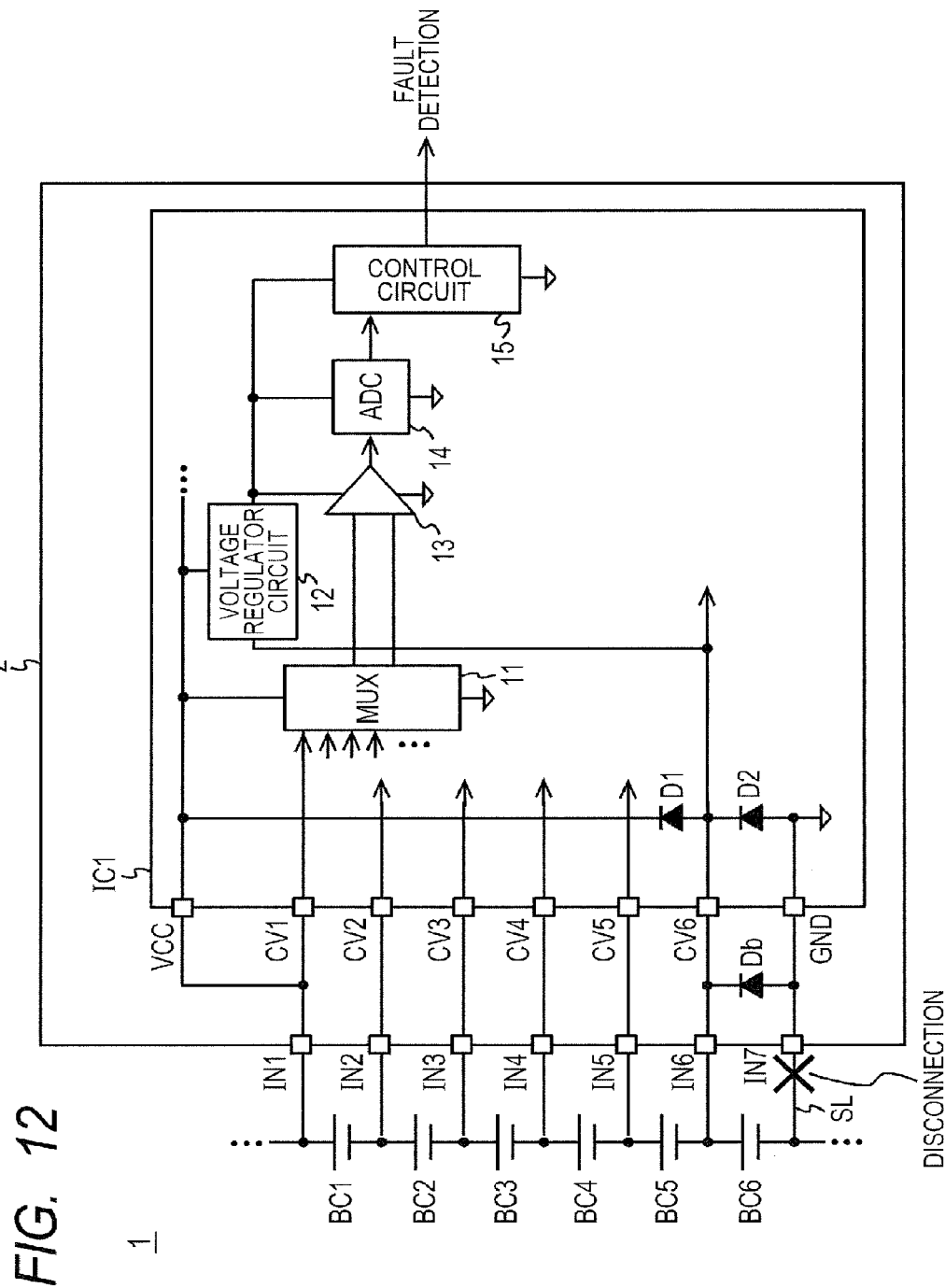
FIG. 12 shows the configuration of an existing battery system.

FIG. 11 shows the relationship between a voltage monitoring module VMMk (k being an arbitrary integer in the range of 1 to n) included in the voltage monitoring system VMS of the third embodiment and a corresponding battery module EMk. For the third embodiment, too, as done for the first embodiment, the registers VMC_REG, control circuit VMC_CON and communication circuit VMC_C that have been described with reference to FIG. 3 are combinedly represented as the control unit CNT for the sake of drawing simplification and the number of battery cells is set to four (EC1 to EC4).

As shown in FIG. 11, the voltage monitoring module VMMk includes a selection circuit VMC_SEL, a power supply circuit VMM_S, an A/D converter (ADC) VMC_ADC, a control unit CNT, a switch circuit SW1, VCC wiring, VSS wiring, VDD wiring, voltage input-terminals V1 to V5, a power supply terminal VCC, a communication input terminal Tin, a communication output terminal Tout, and a terminal T1.

Of the symbols shown in FIG. 11, those which are the same as those shown in FIG. 4 represent configurations the same as or similar to the corresponding configurations shown in FIG. 4. The third embodiment differs from the first embodiment in that the parasitic diode of the switch circuit SW1 is used as an ESD protection diode for the terminal T1.

The switch circuit SW1 is coupled between the terminal T1 and the VSS wiring and turning on/off of the switch circuit SW1 is controlled in accordance with switch control signals from the control unit CNT. The switch circuit SW1 is comprised of an NMOS transistor. The parasitic diode provided between the source and the drain of the NMOS transistor is denoted by "D3" in FIG. 11. When the NMOS transistor of the switch circuit SW1 is in an off-state, the parasitic diode is used as a diode for ESD protection of the terminal T1.

The flow of operation of the voltage monitoring module VMMk is the same as described based on FIG. 6 for the first embodiment. The states of the voltage monitoring module VMMk during operation and the effects of operation are also the same as in the first embodiment.

In the voltage monitoring module VMMk of the third embodiment, the switch circuit SW1 also serves as a diode for ESD protection, so that the diode D2 for ESD protection shown in FIG. 4 for the first embodiment can be removed. Therefore, in the third embodiment, the circuit scale can be made smaller than that of the voltage monitoring module VMMk of the first embodiment.

The present invention is not limited to the above embodiments but can be appropriately modified without departing from the scope of the invention. For example, even though in the first embodiment, the terminal T1 to which the switch circuit SW1 is coupled is assumed to be an address setting terminal coupled to the low-voltage side (ground level) of the battery cell EC4 or an unused terminal terminated at the ground level of an IC chip, the terminal need not be a defined one as long as it is a terminal supplied with the lowest voltage among the terminals provided for the voltage monitoring module VMMk.

For example, assume a case where all address setting terminals are for setting value "1", i.e. coupled to the positive electrode side (supply voltage level) of the battery cell EC1, and no unused terminal of the IC chip is terminated at the ground level resulting in no terminal being coupled to the negative electrode (ground level) of the battery cell EC4. In such a case, a terminal supplied with a voltage which is lower by a predetermined value than the voltage supplied from the power supply circuit VMM_S to the VDD wiring may be made the terminal T1. In this case, the low voltage supplied to the terminal to be the terminal T1 is required to be lower than the voltage applied to the voltage input terminal V4.

A possible example of such terminal is a bias voltage supply terminal for supplying a bias voltage to the voltage monitoring module VMMk. In this case, even with the terminal T1 not coupled to the ground level, the circuit current flows out, like in the first embodiment, through the terminal T1 supplied with the lowest voltage. This makes it possible to detect an open fault at the ground terminal V5 by following, like in the first embodiment, the steps of the flowchart shown in FIG. 6.

In cases where there is no terminal to which a voltage lower than the voltage applied to the voltage input terminal V4 is applied, the circuit current described with reference to FIGS. 7 and 8 flows out through the voltage input terminal V4 via the diode for ESD protection coupled to the voltage input terminal V4. Hence, the voltage input terminal V4 can also be regarded as being equivalent to the terminal T1. In the configuration as described above, the switch circuit SW1 may be coupled between the voltage input terminal V4 and the VSS wiring.

What is claimed is:

1. An apparatus for monitoring a voltage of a battery cell, comprising:
   a first input terminal for coupling with a positive electrode of the battery cell,
   a second input terminal for coupling with a negative electrode of the battery cell,
   an address terminal for coupling with the negative electrode of the battery cell,
   a third input terminal for coupling with an external power supply,
   an output terminal for outputting an output signal,
   a power supply circuit generating an internal power supply voltage based on a voltage difference between the third input terminal and the second input terminal,
   a measurement circuit measuring a voltage difference between the first input terminal and the second input terminal and outputting a measured signal,
   a control circuit outputting the output signal based on the measured signal to the output terminal,
   a power supply wiring for providing the internal power supply voltage to the measurement circuit and the control circuit,
   a ground wiring for providing a ground voltage inputted from the second input terminal to the measurement circuit and the control circuit,
   a first switch circuit for coupling with the address terminal and the ground wiring.

2. An apparatus for monitoring a voltage of a battery cell according to claim 1,
   wherein the first switch circuit has a conducting state controlled in accordance with a control signal from the control circuit.

3. An apparatus for monitoring a voltage of a battery cell according to claim 1,
   wherein the control circuit is coupled to the address terminal.

4. An apparatus for monitoring a voltage of a battery cell according to claim 1, further comprising:
   a diode for ESD protection coupled between the address terminal and the ground wiring.

5. An apparatus for monitoring a voltage of a battery cell according to claim 1,
   wherein the measurement circuit has an A/D converter which converts the voltage between the first input terminal and the second input terminal into a digital value, and outputs the measured signal based on the digital value.

6. An apparatus for monitoring a voltage of a battery cell according to claim 1,
   wherein a voltage level of the ground wiring is substantially changed in accordance with the conducting state of the first switch circuit in case the coupling of the negative electrode of the battery cell and the second input terminal is disconnected,
   wherein a voltage level of the ground wiring is substantially unchanged in accordance with the conducting state of the first switch circuit in case the coupling of the negative electrode of the battery cell and the second input terminal is connected.

7. An apparatus for monitoring a voltage of a battery cell, comprising:
   a first input terminal for coupling with a positive electrode of the battery cell,
   a second input terminal for coupling with a negative electrode of the battery cell,
   an address terminal for coupling with the negative electrode of the battery cell,
   a third input terminal for coupling with an external power supply,
   an output terminal for outputting an output signal,
   a power supply circuit generating an internal power supply voltage based on a voltage difference between the third input terminal and the second input terminal,
   a measurement circuit measuring a voltage difference between the first input terminal and the second input terminal and outputting a measured signal,
   a control circuit outputting the output signal based on the measured signal to the output terminal,
   a power supply wiring for providing the internal power supply voltage to the measurement circuit and the control circuit,
   a ground wiring for providing a ground voltage inputted from the second input terminal to the measurement circuit and the control circuit,
   a first switch circuit for coupling with the address terminal and the ground wiring,
   a diode for ESD protection coupled between the address terminal and the ground wiring,
   wherein the first switch circuit couples the address terminal with the ground wiring in response to a control signal of the control circuit,
   wherein the control circuit is coupled to the address terminal,
   wherein the measurement circuit has an A/D converter which converts the voltage between the first input terminal and the second output terminal into a digital value, and outputs the measured signal based on the digital value,
   wherein a voltage level of the ground wiring is substantially changed in accordance with the conducting state of the first switch circuit in case the coupling of the negative electrode of the battery cell and the second input terminal is disconnected,
   wherein a voltage level of the ground wiring is substantially unchanged in accordance with the conducting state of the first switch circuit in case the coupling of the negative electrode of the battery cell and the second input terminal is connected.

* * * * *